US007284221B2

(12) United States Patent
Winings et al.

(10) Patent No.: US 7,284,221 B2
(45) Date of Patent: Oct. 16, 2007

(54) HIGH-FREQUENCY, HIGH-SIGNAL-DENSITY, SURFACE-MOUNT TECHNOLOGY FOOTPRINT DEFINITIONS

(75) Inventors: Clifford L. Winings, Marco Island, FL (US); Joseph B. Shuey, Camp Hill, PA (US)

(73) Assignee: FCI Americas Technology, Inc., Reno, NV (US)

( * ) Notice: Subject to any disclaimer, the term of this patent is extended or adjusted under 35 U.S.C. 154(b) by 67 days.

(21) Appl. No.: 11/287,951

(22) Filed: Nov. 28, 2005

(65) Prior Publication Data
US 2006/0231833 A1    Oct. 19, 2006

Related U.S. Application Data

(60) Provisional application No. 60/631,499, filed on Nov. 29, 2004.

(51) Int. Cl.
*G06F 17/50* (2006.01)
(52) U.S. Cl. .............................. 716/11; 716/2; 716/10; 716/14
(58) Field of Classification Search .................... 716/1, 716/2, 10, 11, 14
See application file for complete search history.

(56) References Cited

U.S. PATENT DOCUMENTS

| 4,636,919 | A | 1/1987 | Itakura et al. ............. 361/414 |
| 5,516,030 | A * | 5/1996 | Denton ................. 228/180.22 |
| 6,150,729 | A | 11/2000 | Ghahghahi et al. ......... 257/786 |
| 6,198,635 | B1 | 3/2001 | Shenoy et al. .............. 361/760 |
| 6,232,564 | B1 | 5/2001 | Arndt et al. ................ 174/266 |
| 6,538,213 | B1 | 3/2003 | Carden et al. .............. 174/262 |
| 6,717,825 | B2 | 4/2004 | Volstorf ..................... 361/803 |
| 2004/0216071 | A1 | 10/2004 | Miller ......................... 716/12 |
| 2007/0050736 | A1* | 3/2007 | Bickford et al. ............... 716/2 |

FOREIGN PATENT DOCUMENTS

| WO | WO 2005/081595 A2 | 9/2005 |
| WO | WO 2005/081596 A2 | 9/2005 |
| WO | WO 2006/053891 | 5/2006 |

OTHER PUBLICATIONS

De Geest, J. PhD. et al., "Connector Footprint Optimization Enables 10Gb+ Signal Transmission", DesignCon 2005, 1-25.

* cited by examiner

*Primary Examiner*—Thuan Do
(74) *Attorney, Agent, or Firm*—Woodcock Washburn LLP

(57) ABSTRACT

Methods for designing SMT connector footprints are disclosed. A circuit board may have disposed thereon an arrangement of SMT pads and corresponding vias. The arrangement of vias may differ from the arrangement of SMT pads. The arrangement of SMT pads may differ from the arrangement of contacts in a connector the footprint is designed to receive. The terminal ends of the contacts may be jogged or bent for electrical connection with the SMT pads. The SMT pads and vias may be arranged in a number of ways that increase signal contact density of the board, while limiting cross-talk and providing adequate impedance and routing space on the board. An interactive tool for designing such a footprint is disclosed.

20 Claims, 40 Drawing Sheets

BGA Pad and Via calculation

| | Variable | Design | Units | Proposed Minimum |
|---|---|---|---|---|
| INPUT | | | | |
| Layout Designation: | | | | |
| Layout Description: | | | | |
| Pair Pitch | Pairing, Row or Column | | | |
| | Pair pitch, horizontal | Px | mm | |
| | Pair pitch, vertical | Py | mm | |
| Terminals | Width | W | mm | |
| | Height | H | mm | |
| | Terminal to terminal, in-pair horiz | Pt-tx | mm | |
| | Terminal to terminal, in-pair vertical | Pt-ty | mm | |
| BGA Balls & Pads | BGA ball dia | Db | mm | 0.60 |
| | BGA pad dia | Dbp | mm | |
| | Pitch Pad - pad, in-pair horiz | Pbbx | mm | |
| | Pitch Pad-pad , inpair vertical | Pbby | mm | |
| Vias | Via drill diameter | Dd | mm | 0.27 |
| | Anular ring | AR | mm | 0.15 |
| | Pitch via-via, in-pair horiz | Pvvx | mm | |
| | Pitch via-via , inpair vertical | Pvvy | mm | |
| | Drill to trace clearance | Cdt | mm | 0.25 |

FIG. 5A

| RESULTS | | | | |
|---|---|---|---|---|
| Density | Density (in-grid) | | pr / in^2 | 124 |
| Vias | Via-via2 (pr-pr) | Pw2 | mm | 1.30 |
| Ball-to-ball & Ball-to-via Pitch (ctr-ctr) | Min Pitch BGApad to via (in-pr or pr-pr) | Pbv | mm | 0.86 |
| X-talk | Nxt balls prs 1-2 | NxtB12 | % | -0.40 |
| | Nxt balls prs 1-3 | NxtB13 | % | 0.19 |
| | Nxt balls prs 2-3 | NxtB23 | % | 0.19 |
| | Multiactive Nxt balls Isolation | MXtBdB | dB | 36 |
| | Nxt vias prs 1-2 | NxtV12 | % | -0.81 |
| | Nxt vias prs 1-3 | NxtV13 | % | 0.40 |
| | Nxt vias prs 2-3 | NxtV23 | % | 0.40 |
| | Multiactive Nxt Via Isolation | MXtVdB | dB | 30 |
| Impedance | Differential impedance balls | ZoB | ohm | 127 |
| | Differential impedance vias | ZoV | ohm | 79 |
| Dogbone & Clearance | Dogbone BGApad to viapad (in-dogbone) | Cbv(db) | mm | 0.29 |
| | Min clearance Ball to Ball | Cbb | mm | 0.54 |
| | Viapad to viapad 2 (pr-pr) | Cw2 | mm | 0.73 |
| | Min clearance Viapad to Viapad | Cw | mm | 0.73 |
| | Min clearance BGApad to Viapad | Cbv | mm | 0.29 |
| Routing Width & Trace Width | Clearance pad-trace (internal) | Cpt | mm | 0.15 |
| | Indicated trace width straight = RWx / 3.2 | Wx | mm | 0.38 |
| | Indicated trace width serpentine = RWd / 3.2 | Ws | mm | 0.38 |

FIG. 5B

| # | B | C | D | E | F | G |
|---|---|---|---|---|---|---|
| 1 | BGA Pad and Via calculation | | | | | |
| 2 | | | | | | |
| 3 | | Variable | Design | Units | Proposed Minimum Rqmt. | Value |
| 4 | INPUT | | | | | |
| 5 | Layout Description: | | | | | In-line vias. BGA pads staggered left & right in-line with vias. Max density while meeting proposed rqmts. |
| 6 | | | | | | |
| 7 | | Pairing, Row or Column | | | | Col |
| 8 | Pair Pitch | Pair pitch, horizontal | Px | mm | | 1.25 |
| 9 | | Pair pitch, vertical | Py | mm | | 1.95 |
| 10 | Terminals | Width | W | mm | | 0.15 |
| 11 | | Height | H | mm | | 0.25 |
| 12 | | Terminal to terminal, in-pair horiz | Pt-tx | mm | | 0.3 |
| 13 | | Terminal to terminal, in-pair vertical | Pt-ty | mm | | 0 |
| 14 | BGA Balls & Pads | BGA ball dia | Db | mm | =Compare!$F$9 | 0.6 |
| 15 | | BGA pad dia | Dbp | mm | | 0.45 |
| 16 | | Pitch Pad - pad, in-pair horiz | Pbbx | mm | | 0.92 |
| 17 | | Pitch Pad-pad, inpair vertical | Pbby | mm | | 0.77 |
| 18 | Vias | Via drill diameter | Dd | mm | =Compare!$F$13 | 0.27 |
| 19 | | Anular ring | AR | mm | =Compare!$F$14 | 0.15 |
| 20 | | Pitch via-via, in-pair horiz | Pvvx | mm | | 0 |
| 21 | | Pitch via-via , inpair vertical | Pvvy | mm | | 0.77 |
| 22 | | Drill to trace clearance | Cdt | mm | =Compare!$F$26 | 0.25 |

FIG. 8

| | B | C | D | E | F | G |
|---|---|---|---|---|---|---|
| 24 | RESULTS | | | | | |
| 25 | Density | Density (in-grid) | | pr/in^2 | =Compare!$F$8 | =25.4^2/(G8*G9) |
| 34 | | Nxt balls prs 1-2 | NxtB12 | % | | =F265 |
| 35 | | Nxt balls prs 1-3 | NxtB13 | % | | =J265 |
| 36 | X-talk | Nxt balls prs 2-3 | NxtB23 | % | | =N265 |
| 38 | | Multiactive Nxt balls Isolation | MXtBdB | dB | =Compare!$F$17 | =-20*LOG(ABS(G37)/100) |
| 39 | | Nxt vias prs 1-2 | NxtV12 | % | | =R265 |
| 40 | | Nxt vias prs 1-3 | NxtV13 | % | | =V265 |
| 41 | | Nxt vias prs 2-3 | NxtV23 | % | | =AB265 |
| 43 | | Multiactive Nxt Via Isolation | MXtVdB | dB | =Compare!$F$19 | =-20*LOG(ABS(G42)/100) |
| 44 | Impedance | Differential impedance balls | ZoB | ohm | =Compare!$F$20 | =AA44 |
| 45 | | Differential impedance vias | ZoV | ohm | =Compare!$F$21 | =AA45 |
| 46 | | Dogbone BGApad to viapad (in-dogbone)) | Cbv(db) | mm | -0.004 | =G30-G15/2-G26/2 |
| 49 | Dogbone & Clearance | Min clearance Ball to Ball | Cbb | mm | =Compare!$F$23 | =MIN(G47:G48) |
| 52 | | Min clearance Viapad to Viapad | Cvv | mm | =Compare!$F$24 | =MIN(G50:G51) |
| 53 | | Min clearance BGApad to Viapad | Cbv | mm | =Compare!$F$25 | =G33-G26/2-G15/2 |
| 54 | Routing Width & Trace Width | Clearance pad-trace (internal) | Cpt | mm | 0.1 | =G22+0.1-G19 |
| 57 | | Indicated trace width straight = RWx / 3.2 | Wx | mm | =Compare!$F$27 | =G55/3.2 |
| 58 | | icated trace width serpentine = RWd / 3.2 | Ws | mm | =Compare!$F$28 | =G56/3.2 |

FIG. 9

| | W | X | Y | Z | AA |
|---|---|---|---|---|---|
| 40 | | | | | Adj |
| 41 | | twinax | coax | Parallel | Parallel |
| 43 | epsr | Ztx | Zcx | Zop | Zodiff |
| 44 | 1 | 168 | 200 | 118 | 143 |
| 45 | 4 | 100 | 51 | 50 | 75 |

FIG. 10

| | B | C | D | E | F | G |
|---|---|---|---|---|---|---|
| 66 | VALUES FOR SUMMARY TABLE | | | | | |
| 67 | | Variable | Desig | Units | Proposed Minimum Rqmt. | |
| 68 | Description | | | | | |
| 69 | | Pairing, Row or Column | | | | =G5 |
| 70 | Pair Pitch and Density | Pair pitch, horizontal | Px | mm | | =G7 |
| 71 | | Pair pitch, vertical | Py | mm | | =G8 |
| 72 | | Ground / Signal Ratio | Rg | | | =G9 |
| 73 | | Density (in-grid) | | pr / in^2 | | 0 |
| 74 | BGA Balls & Pads | BGA ball diameter | Db | mm | | =G25 |
| 75 | | BGA pad dia | Dbp | mm | | =G14 |
| 76 | | Pitch BGApad to BGApad 1 (in-pair) | Pbb1 | mm | | =G15 |
| 77 | | Pitch BGApad to BGApad 2 (pr-pr or pr-gnd) | Pbb2 | mm | | =G31 |
| 78 | Vias | Via drill diameter | Dd | mm | | =G32 |
| 79 | | Anular ring | AR | mm | =F18 | =G18 |
| 80 | | Min clearance via wall - via wall | Cww | mm | =F19 | =G19 |
| 81 | X-talk | Multiactive Nxt balls | MXtB | % | =F29 | =G29 |
| 82 | | Multiactive Nxt isolation balls | MXtBdB | dB | | =G37 |
| 83 | | Multiactive Nxt vias | MXtV | % | =F38 | =G38 |
| 84 | | Multiactive Nxt isolataion vias | MXtVdB | dB | | =G42 |
| 85 | Impedance | Differential impedance balls | ZoB | ohm | =F43 | =G43 |
| 86 | | Differential impedance vias | ZoV | ohm | =F44 | =G44 |
| 87 | Clearance | Dogbone BGApad to viapad (in-dogbone)) | Cbv(db) | mm | =F45 | =G45 |
| 88 | | Min clearance Ball to Ball | Cbb | mm | =F46 | =G46 |
| 89 | | Min clearance Viapad to Viapad | Cvv | mm | =F49 | =G49 |
| 90 | | Min clearance BGApad to Viapad | Cbv | mm | =F52 | =G52 |
| 91 | | Drill to trace clearance | Cdt | mm | =F53 | =G53 |
| 92 | Trace Width | Indicated trace width straight = RWx / 3.2 | Wx | mm | =F22 | =G22 |
| 93 | | Indicated trace width serpentine = RWd / 3.2 | Ws | mm | =F57 | =G57 |
| | | | | | =F58 | =G58 |

FIG. 11

| | I | J | K | L | M | N |
|---|---|---|---|---|---|---|
| 98 | | Offset to plot Axes: | | | X0 | Y0 |
| 99 | | | | | 1 | 1 |
| 100 | INPUT values for calculating plot points | | | | | |
| 101 | | Circles | Dia | x | y | |
| 102 | 1 | 1aBP | =AMz1a!$G$15 | =-AMz1a!$G$16/2+M99 | =-AMz1a!G17/2+N99 | |
| 103 | 2 | 1aV | =AMz1a!$G$18 | =AMz1a!$G$20/2+M99 | =-AMz1a!$G$21/2+N99 | |
| 104 | 3 | 1aVP | =AMz1a!$G$26 | =AMz1a!$G$20/2+M99 | =-AMz1a!$G$21/2+N99 | |
| 105 | 4 | 1bBP | =AMz1a!$G$15 | =AMz1a!$G$16/2+M99 | =AMz1a!G17/2+N99 | |
| 106 | 5 | 1bV | =AMz1a!$G$18 | =-AMz1a!$G$20/2+M99 | =AMz1a!$G$21/2+N99 | |
| 107 | 6 | 1bVP | =AMz1a!$G$26 | =-AMz1a!$G$20/2+M99 | =AMz1a!$G$21/2+N99 | |
| 108 | 7 | 2aBP | =AMz1a!$G$15 | =L102 | =M102+AMz1a!$G$9 | |
| 109 | 8 | 2aV | =AMz1a!$G$18 | =L103 | =M103+AMz1a!$G$9 | |
| 110 | 9 | 2aVP | =AMz1a!$G$26 | =L104 | =M104+AMz1a!$G$9 | |
| 111 | 10 | 2bBP | =AMz1a!$G$15 | =L105 | =M105+AMz1a!$G$9 | |
| 112 | 11 | 2bV | =AMz1a!$G$18 | =L106 | =M106+AMz1a!$G$9 | |
| 113 | 12 | 2bVP | =AMz1a!$G$26 | =L107 | =M107+AMz1a!$G$9 | |
| 114 | 13 | 3aBP | =AMz1a!$G$15 | =L105+AMz1a!$G$8 | =M102+AMz1a!$G$9/2 | |
| 115 | 14 | 3aV | =AMz1a!$G$18 | =L106+AMz1a!$G$8 | =M103+AMz1a!$G$9/2 | |
| 116 | 15 | 3aVP | =AMz1a!$G$26 | =L107+AMz1a!$G$8 | =M104+AMz1a!$G$9/2 | |
| 117 | 16 | 3bBP | =AMz1a!$G$15 | =L102+AMz1a!$G$8 | =M105+AMz1a!$G$9/2 | |
| 118 | 17 | 3bV | =AMz1a!$G$18 | =L103+AMz1a!$G$8 | =M106+AMz1a!$G$9/2 | |
| 119 | 18 | 3bVP | =AMz1a!$G$26 | =L104+AMz1a!$G$8 | =M107+AMz1a!$G$9/2 | |

|     | O     | P     | Q     |
|-----|-------|-------|-------|
| 101 | Lines |       |       |
| 102 |       |       |       |
| 103 | pt 1  | x     | pr1   |
| 104 | pt 2  | =L103 | =M103 |
| 105 |       | =L106 | =M106 |
| 106 |       |       |       |
| 107 | pt1   | x     | pr2   |
| 108 | pt2   | =P103 | =M109 |
| 109 |       | =P104 | =M112 |
| 110 |       |       |       |
| 111 | pt1   | x     | pr3   |
| 112 | pt2   | =L115 | =M115 |
|     |       | =L118 | =M118 |

FIG. 14

|     | S | T | U | V | W | X | Y |
|-----|---|---|---|---|---|---|---|
| 101 | Rectangles | | | | | | |
| 102 | | | width | height | x | | y |
| 103 | 1 | T1a | =AMz1a!$G$10 | =AMz1a!$G$11 | =-AMz1a!G12/2+AMz1a!M99 | | =-AMz1a!G13/2+AMz1a!N99 |
| 104 | 2 | T1b | =AMz1a!$G$10 | =AMz1a!$G$11 | =+AMz1a!G12/2+AMz1a!M99 | | =AMz1a!G13/2+AMz1a!N99 |
| 105 | 3 | T2a | =AMz1a!$G$10 | =AMz1a!$G$11 | =W103 | | =Y103+AMz1a!G9 |
| 106 | 4 | T2b | =AMz1a!$G$10 | =AMz1a!$G$11 | =W104 | | =Y104+AMz1a!G9 |
| 107 | 5 | T3a | =AMz1a!$G$10 | =AMz1a!$G$11 | =W104+AMz1a!G8 | | =Y103+AMz1a!G9/2 |
| 108 | 6 | T3b | =AMz1a!$G$10 | =AMz1a!$G$11 | =W103+AMz1a!G8 | | =Y104+AMz1a!G9/2 |

FIG. 15

| | I | J | K | L | M |
|---|---|---|---|---|---|
| | | | Plot points for Rectangles | | |
| 122 | | | | | |
| 123 | width | =AMz1a!U103 | | =AMz1a!U104 | |
| 124 | height | =AMz1a!V103 | | =AMz1a!V104 | |
| 125 | center x | =AMz1a!W103 | | =AMz1a!W104 | |
| 126 | center y | =AMz1a!Y103 | | =AMz1a!Y104 | |
| 127 | | x | =AMz1a!T103 | x | =AMz1a!T104 |
| 128 | | =J125-J123/2 | =J126-J124/2 | =L125-L123/2 | =L126-L124/2 |
| 129 | | =J128 | =K128+J124 | =L128 | =M128+L124 |
| 130 | | =J129+J123 | =K129 | =L129+L123 | =M129 |
| 131 | | =J130 | =K128 | =L130 | =M128 |
| 132 | | =J128 | =K128 | =L128 | =M128 |

FIG. 16

| | N | O | P | Q | R | S | T | U |
|---|---|---|---|---|---|---|---|---|
| 123 | =AMz1a!U105 | | =AMz1a!U106 | | =AMz1a!U107 | | =AMz1a!U108 | |
| 124 | =AMz1a!V105 | | =AMz1a!V106 | | =AMz1a!V107 | | =AMz1a!V108 | |
| 125 | =AMz1a!W105 | | =AMz1a!W106 | | =AMz1a!W107 | | =AMz1a!W108 | |
| 126 | =AMz1a!Y105 | | =AMz1a!Y106 | | =AMz1a!Y107 | | =AMz1a!Y108 | |
| 127 | x | =AMz1a!T105 | x | =AMz1a!T106 | x | =AMz1a!T107 | x | =AMz1a!T108 |
| 128 | =N125-N123/2 | =N126-N124/2 | =P125-P123/2 | =P126-P124/2 | =R125-R123/2 | =R126-R124/2 | =T125-T123/2 | =T126-T124/2 |
| 129 | =N128 | =O128+N124 | =P128 | =Q128+P124 | =R128 | =S128+R124 | =T128 | =U128+T124 |
| 130 | =N129+N123 | =O129 | =P129+P123 | =Q129 | =R129+R123 | =S129 | =T129+T123 | =U129 |
| 131 | =N130 | =O128 | =P130 | =Q128 | =R130 | =S128 | =T130 | =U128 |
| 132 | =N128 | =O128 | =P128 | =Q128 | =R128 | =S128 | =T128 | =U128 |

FIG. 17

| | I | J | K | L | M | N | O | P | Q |
|---|---|---|---|---|---|---|---|---|---|
| 134 | | | Plot points for Circles | | | | | | |
| 135 | radius | =AMz1a!K102/2 | | =AMz1a!K103/2 | | =AMz1a!K104/2 | | =AMz1a!K105/2 | |
| 136 | center x | =AMz1a!L102 | | =AMz1a!L103 | | =AMz1a!L104 | | =AMz1a!L105 | |
| 137 | center y | =AMz1a!M102 | | =AMz1a!M103 | | =AMz1a!M104 | | =AMz1a!M105 | |

FIG. 18

| | R | S | T | U | V | W | X | Y |
|---|---|---|---|---|---|---|---|---|
| 134 | | | | | | | | |
| 135 | =AMz1a!K106/2 | | =AMz1a!K107/2 | | =AMz1a!K108/2 | | =AMz1a!K109/2 | |
| 136 | =AMz1a!L106 | | =AMz1a!L107 | | =AMz1a!L108 | | =AMz1a!L109 | |
| 137 | =AMz1a!M106 | | =AMz1a!M107 | | =AMz1a!M108 | | =AMz1a!M109 | |

FIG. 19

| | AB | AC | AD | AE | AF | AG | AH | AI | AJ |
|---|---|---|---|---|---|---|---|---|---|
| 134 | | | | | | | | | |
| 135 | =AMz1a!K110/2 | | =AMz1a!K111/2 | | =AMz1a!K112/2 | | =AMz1a!K113/2 | | =AMz1a!K114/2 |
| 136 | =AMz1a!L110 | | =AMz1a!L111 | | =AMz1a!L112 | | =AMz1a!L113 | | =AMz1a!L114 |
| 137 | =AMz1a!M110 | | =AMz1a!M111 | | =AMz1a!M112 | | =AMz1a!M113 | | =AMz1a!M114 |

FIG. 20

| | AL | AM | AN | AO | AP | AQ | AR | AS | AT |
|---|---|---|---|---|---|---|---|---|---|
| 134 | | | | | | | | | |
| 135 | =AMz1a!K115/2 | | =AMz1a!K116/2 | | =AMz1a!K117/2 | | =AMz1a!K118/2 | | =AMz1a!K119/2 |
| 136 | =AMz1a!L115 | | =AMz1a!L115 | | =AMz1a!L117 | | =AMz1a!L118 | | =AMz1a!L119 |
| 137 | =AMz1a!M115 | | =AMz1a!M116 | | =AMz1a!M117 | | =AMz1a!M118 | | =AMz1a!M119 |

FIG. 21

| | N | O | P | Q | R |
|---|---|---|---|---|---|
| | x | =AMz1aIJ104 | x | =AMz1aIJ105 | x |
| 138 | | | | | |
| 139 | =N$136+N$135*COS($I139) | =N$137+N$135*SIN($I139) | =P$136+P$135*COS($I139) | =P$137+P$135*SIN($I139) | =R$136+R$135*COS($I139) |
| 140 | =N$136+N$135*COS($I140) | =N$137+N$135*SIN($I140) | =P$136+P$135*COS($I140) | =P$137+P$135*SIN($I140) | =R$136+R$135*COS($I140) |
| 141 | =N$136+N$135*COS($I141) | =N$137+N$135*SIN($I141) | =P$136+P$135*COS($I141) | =P$137+P$135*SIN($I141) | =R$136+R$135*COS($I141) |
| 142 | =N$136+N$135*COS($I142) | =N$137+N$135*SIN($I142) | =P$136+P$135*COS($I142) | =P$137+P$135*SIN($I142) | =R$136+R$135*COS($I142) |
| 143 | =N$136+N$135*COS($I143) | =N$137+N$135*SIN($I143) | =P$136+P$135*COS($I143) | =P$137+P$135*SIN($I143) | =R$136+R$135*COS($I143) |
| 144 | =N$136+N$135*COS($I144) | =N$137+N$135*SIN($I144) | =P$136+P$135*COS($I144) | =P$137+P$135*SIN($I144) | =R$136+R$135*COS($I144) |
| 145 | =N$136+N$135*COS($I145) | =N$137+N$135*SIN($I145) | =P$136+P$135*COS($I145) | =P$137+P$135*SIN($I145) | =R$136+R$135*COS($I145) |
| 146 | =N$136+N$135*COS($I146) | =N$137+N$135*SIN($I146) | =P$136+P$135*COS($I146) | =P$137+P$135*SIN($I146) | =R$136+R$135*COS($I146) |
| 147 | =N$136+N$135*COS($I147) | =N$137+N$135*SIN($I147) | =P$136+P$135*COS($I147) | =P$137+P$135*SIN($I147) | =R$136+R$135*COS($I147) |
| 148 | =N$136+N$135*COS($I148) | =N$137+N$135*SIN($I148) | =P$136+P$135*COS($I148) | =P$137+P$135*SIN($I148) | =R$136+R$135*COS($I148) |
| 149 | =N$136+N$135*COS($I149) | =N$137+N$135*SIN($I149) | =P$136+P$135*COS($I149) | =P$137+P$135*SIN($I149) | =R$136+R$135*COS($I149) |
| 150 | =N$136+N$135*COS($I150) | =N$137+N$135*SIN($I150) | =P$136+P$135*COS($I150) | =P$137+P$135*SIN($I150) | =R$136+R$135*COS($I150) |
| 151 | =N$136+N$135*COS($I151) | =N$137+N$135*SIN($I151) | =P$136+P$135*COS($I151) | =P$137+P$135*SIN($I151) | =R$136+R$135*COS($I151) |
| 152 | =N$136+N$135*COS($I152) | =N$137+N$135*SIN($I152) | =P$136+P$135*COS($I152) | =P$137+P$135*SIN($I152) | =R$136+R$135*COS($I152) |
| 153 | =N$136+N$135*COS($I153) | =N$137+N$135*SIN($I153) | =P$136+P$135*COS($I153) | =P$137+P$135*SIN($I153) | =R$136+R$135*COS($I153) |
| 154 | =N$136+N$135*COS($I154) | =N$137+N$135*SIN($I154) | =P$136+P$135*COS($I154) | =P$137+P$135*SIN($I154) | =R$136+R$135*COS($I154) |
| 155 | =N$136+N$135*COS($I155) | =N$137+N$135*SIN($I155) | =P$136+P$135*COS($I155) | =P$137+P$135*SIN($I155) | =R$136+R$135*COS($I155) |
| 156 | =N$136+N$135*COS($I156) | =N$137+N$135*SIN($I156) | =P$136+P$135*COS($I156) | =P$137+P$135*SIN($I156) | =R$136+R$135*COS($I156) |
| 157 | =N$136+N$135*COS($I157) | =N$137+N$135*SIN($I157) | =P$136+P$135*COS($I157) | =P$137+P$135*SIN($I157) | =R$136+R$135*COS($I157) |
| 158 | =N$136+N$135*COS($I158) | =N$137+N$135*SIN($I158) | =P$136+P$135*COS($I158) | =P$137+P$135*SIN($I158) | =R$136+R$135*COS($I158) |
| 159 | =N$136+N$135*COS($I159) | =N$137+N$135*SIN($I159) | =P$136+P$135*COS($I159) | =P$137+P$135*SIN($I159) | =R$136+R$135*COS($I159) |
| 160 | =N$136+N$135*COS($I160) | =N$137+N$135*SIN($I160) | =P$136+P$135*COS($I160) | =P$137+P$135*SIN($I160) | =R$136+R$135*COS($I160) |
| 161 | =N$136+N$135*COS($I161) | =N$137+N$135*SIN($I161) | =P$136+P$135*COS($I161) | =P$137+P$135*SIN($I161) | =R$136+R$135*COS($I161) |
| 162 | =N$136+N$135*COS($I162) | =N$137+N$135*SIN($I162) | =P$136+P$135*COS($I162) | =P$137+P$135*SIN($I162) | =R$136+R$135*COS($I162) |
| 163 | =N$136+N$135*COS($I163) | =N$137+N$135*SIN($I163) | =P$136+P$135*COS($I163) | =P$137+P$135*SIN($I163) | =R$136+R$135*COS($I163) |
| 164 | =N$136+N$135*COS($I164) | =N$137+N$135*SIN($I164) | =P$136+P$135*COS($I164) | =P$137+P$135*SIN($I164) | =R$136+R$135*COS($I164) |
| 165 | =N$136+N$135*COS($I165) | =N$137+N$135*SIN($I165) | =P$136+P$135*COS($I165) | =P$137+P$135*SIN($I165) | =R$136+R$135*COS($I165) |
| 166 | =N$136+N$135*COS($I166) | =N$137+N$135*SIN($I166) | =P$136+P$135*COS($I166) | =P$137+P$135*SIN($I166) | =R$136+R$135*COS($I166) |
| 167 | =N$136+N$135*COS($I167) | =N$137+N$135*SIN($I167) | =P$136+P$135*COS($I167) | =P$137+P$135*SIN($I167) | =R$136+R$135*COS($I167) |
| 168 | =N$136+N$135*COS($I168) | =N$137+N$135*SIN($I168) | =P$136+P$135*COS($I168) | =P$137+P$135*SIN($I168) | =R$136+R$135*COS($I168) |
| 169 | =N$136+N$135*COS($I169) | =N$137+N$135*SIN($I169) | =P$136+P$135*COS($I169) | =P$137+P$135*SIN($I169) | =R$136+R$135*COS($I169) |
| 170 | =N$136+N$135*COS($I170) | =N$137+N$135*SIN($I170) | =P$136+P$135*COS($I170) | =P$137+P$135*SIN($I170) | =R$136+R$135*COS($I170) |
| 171 | =N$136+N$135*COS($I171) | =N$137+N$135*SIN($I171) | =P$136+P$135*COS($I171) | =P$137+P$135*SIN($I171) | =R$136+R$135*COS($I171) |
| 172 | =N$136+N$135*COS($I172) | =N$137+N$135*SIN($I172) | =P$136+P$135*COS($I172) | =P$137+P$135*SIN($I172) | =R$136+R$135*COS($I172) |
| 173 | =N$136+N$135*COS($I173) | =N$137+N$135*SIN($I173) | =P$136+P$135*COS($I173) | =P$137+P$135*SIN($I173) | =R$136+R$135*COS($I173) |
| 174 | =N$136+N$135*COS($I174) | =N$137+N$135*SIN($I174) | =P$136+P$135*COS($I174) | =P$137+P$135*SIN($I174) | =R$136+R$135*COS($I174) |
| 175 | =N$136+N$135*COS($I175) | =N$137+N$135*SIN($I175) | =P$136+P$135*COS($I175) | =P$137+P$135*SIN($I175) | =R$136+R$135*COS($I175) |

FIG. 22

| | S | T | U | V | W |
|---|---|---|---|---|---|
| 138 | =AMz1aIJ106 | x | =AMz1aIJ107 | x | =AMz1aIJ108 |
| 139 | =R$137+R$135*SIN*SIN($I139) | =T$136+T$135*COS($I139) | =T$137+T$135*SIN*SIN($I139) | =V$136+V$135*COS($I139) | =V$137+V$135*SIN*SIN($I139) |
| 140 | =R$137+R$135*SIN*SIN($I140) | =T$136+T$135*COS($I140) | =T$137+T$135*SIN*SIN($I140) | =V$136+V$135*COS($I140) | =V$137+V$135*SIN*SIN($I140) |
| 141 | =R$137+R$135*SIN*SIN($I141) | =T$136+T$135*COS($I141) | =T$137+T$135*SIN*SIN($I141) | =V$136+V$135*COS($I141) | =V$137+V$135*SIN*SIN($I141) |
| 142 | =R$137+R$135*SIN*SIN($I142) | =T$136+T$135*COS($I142) | =T$137+T$135*SIN*SIN($I142) | =V$136+V$135*COS($I142) | =V$137+V$135*SIN*SIN($I142) |
| 143 | =R$137+R$135*SIN*SIN($I143) | =T$136+T$135*COS($I143) | =T$137+T$135*SIN*SIN($I143) | =V$136+V$135*COS($I143) | =V$137+V$135*SIN*SIN($I143) |
| 144 | =R$137+R$135*SIN*SIN($I144) | =T$136+T$135*COS($I144) | =T$137+T$135*SIN*SIN($I144) | =V$136+V$135*COS($I144) | =V$137+V$135*SIN*SIN($I144) |
| 145 | =R$137+R$135*SIN*SIN($I145) | =T$136+T$135*COS($I145) | =T$137+T$135*SIN*SIN($I145) | =V$136+V$135*COS($I145) | =V$137+V$135*SIN*SIN($I145) |
| 146 | =R$137+R$135*SIN*SIN($I146) | =T$136+T$135*COS($I146) | =T$137+T$135*SIN*SIN($I146) | =V$136+V$135*COS($I146) | =V$137+V$135*SIN*SIN($I146) |
| 147 | =R$137+R$135*SIN*SIN($I147) | =T$136+T$135*COS($I147) | =T$137+T$135*SIN*SIN($I147) | =V$136+V$135*COS($I147) | =V$137+V$135*SIN*SIN($I147) |
| 148 | =R$137+R$135*SIN*SIN($I148) | =T$136+T$135*COS($I148) | =T$137+T$135*SIN*SIN($I148) | =V$136+V$135*COS($I148) | =V$137+V$135*SIN*SIN($I148) |
| 149 | =R$137+R$135*SIN*SIN($I149) | =T$136+T$135*COS($I149) | =T$137+T$135*SIN*SIN($I149) | =V$136+V$135*COS($I149) | =V$137+V$135*SIN*SIN($I149) |
| 150 | =R$137+R$135*SIN*SIN($I150) | =T$136+T$135*COS($I150) | =T$137+T$135*SIN*SIN($I150) | =V$136+V$135*COS($I150) | =V$137+V$135*SIN*SIN($I150) |
| 151 | =R$137+R$135*SIN*SIN($I151) | =T$136+T$135*COS($I151) | =T$137+T$135*SIN*SIN($I151) | =V$136+V$135*COS($I151) | =V$137+V$135*SIN*SIN($I151) |
| 152 | =R$137+R$135*SIN*SIN($I152) | =T$136+T$135*COS($I152) | =T$137+T$135*SIN*SIN($I152) | =V$136+V$135*COS($I152) | =V$137+V$135*SIN*SIN($I152) |
| 153 | =R$137+R$135*SIN*SIN($I153) | =T$136+T$135*COS($I153) | =T$137+T$135*SIN*SIN($I153) | =V$136+V$135*COS($I153) | =V$137+V$135*SIN*SIN($I153) |
| 154 | =R$137+R$135*SIN*SIN($I154) | =T$136+T$135*COS($I154) | =T$137+T$135*SIN*SIN($I154) | =V$136+V$135*COS($I154) | =V$137+V$135*SIN*SIN($I154) |
| 155 | =R$137+R$135*SIN*SIN($I155) | =T$136+T$135*COS($I155) | =T$137+T$135*SIN*SIN($I155) | =V$136+V$135*COS($I155) | =V$137+V$135*SIN*SIN($I155) |
| 156 | =R$137+R$135*SIN*SIN($I156) | =T$136+T$135*COS($I156) | =T$137+T$135*SIN*SIN($I156) | =V$136+V$135*COS($I156) | =V$137+V$135*SIN*SIN($I156) |
| 157 | =R$137+R$135*SIN*SIN($I157) | =T$136+T$135*COS($I157) | =T$137+T$135*SIN*SIN($I157) | =V$136+V$135*COS($I157) | =V$137+V$135*SIN*SIN($I157) |
| 158 | =R$137+R$135*SIN*SIN($I158) | =T$136+T$135*COS($I158) | =T$137+T$135*SIN*SIN($I158) | =V$136+V$135*COS($I158) | =V$137+V$135*SIN*SIN($I158) |
| 159 | =R$137+R$135*SIN*SIN($I159) | =T$136+T$135*COS($I159) | =T$137+T$135*SIN*SIN($I159) | =V$136+V$135*COS($I159) | =V$137+V$135*SIN*SIN($I159) |
| 160 | =R$137+R$135*SIN*SIN($I160) | =T$136+T$135*COS($I160) | =T$137+T$135*SIN*SIN($I160) | =V$136+V$135*COS($I160) | =V$137+V$135*SIN*SIN($I160) |
| 161 | =R$137+R$135*SIN*SIN($I161) | =T$136+T$135*COS($I161) | =T$137+T$135*SIN*SIN($I161) | =V$136+V$135*COS($I161) | =V$137+V$135*SIN*SIN($I161) |
| 162 | =R$137+R$135*SIN*SIN($I162) | =T$136+T$135*COS($I162) | =T$137+T$135*SIN*SIN($I162) | =V$136+V$135*COS($I162) | =V$137+V$135*SIN*SIN($I162) |
| 163 | =R$137+R$135*SIN*SIN($I163) | =T$136+T$135*COS($I163) | =T$137+T$135*SIN*SIN($I163) | =V$136+V$135*COS($I163) | =V$137+V$135*SIN*SIN($I163) |
| 164 | =R$137+R$135*SIN*SIN($I164) | =T$136+T$135*COS($I164) | =T$137+T$135*SIN*SIN($I164) | =V$136+V$135*COS($I164) | =V$137+V$135*SIN*SIN($I164) |
| 165 | =R$137+R$135*SIN*SIN($I165) | =T$136+T$135*COS($I165) | =T$137+T$135*SIN*SIN($I165) | =V$136+V$135*COS($I165) | =V$137+V$135*SIN*SIN($I165) |
| 166 | =R$137+R$135*SIN*SIN($I166) | =T$136+T$135*COS($I166) | =T$137+T$135*SIN*SIN($I166) | =V$136+V$135*COS($I166) | =V$137+V$135*SIN*SIN($I166) |
| 167 | =R$137+R$135*SIN*SIN($I167) | =T$136+T$135*COS($I167) | =T$137+T$135*SIN*SIN($I167) | =V$136+V$135*COS($I167) | =V$137+V$135*SIN*SIN($I167) |
| 168 | =R$137+R$135*SIN*SIN($I168) | =T$136+T$135*COS($I168) | =T$137+T$135*SIN*SIN($I168) | =V$136+V$135*COS($I168) | =V$137+V$135*SIN*SIN($I168) |
| 169 | =R$137+R$135*SIN*SIN($I169) | =T$136+T$135*COS($I169) | =T$137+T$135*SIN*SIN($I169) | =V$136+V$135*COS($I169) | =V$137+V$135*SIN*SIN($I169) |
| 170 | =R$137+R$135*SIN*SIN($I170) | =T$136+T$135*COS($I170) | =T$137+T$135*SIN*SIN($I170) | =V$136+V$135*COS($I170) | =V$137+V$135*SIN*SIN($I170) |
| 171 | =R$137+R$135*SIN*SIN($I171) | =T$136+T$135*COS($I171) | =T$137+T$135*SIN*SIN($I171) | =V$136+V$135*COS($I171) | =V$137+V$135*SIN*SIN($I171) |
| 172 | =R$137+R$135*SIN*SIN($I172) | =T$136+T$135*COS($I172) | =T$137+T$135*SIN*SIN($I172) | =V$136+V$135*COS($I172) | =V$137+V$135*SIN*SIN($I172) |
| 173 | =R$137+R$135*SIN*SIN($I173) | =T$136+T$135*COS($I173) | =T$137+T$135*SIN*SIN($I173) | =V$136+V$135*COS($I173) | =V$137+V$135*SIN*SIN($I173) |
| 174 | =R$137+R$135*SIN*SIN($I174) | =T$136+T$135*COS($I174) | =T$137+T$135*SIN*SIN($I174) | =V$136+V$135*COS($I174) | =V$137+V$135*SIN*SIN($I174) |
| 175 | =R$137+R$135*SIN*SIN($I175) | =T$136+T$135*COS($I175) | =T$137+T$135*SIN*SIN($I175) | =V$136+V$135*COS($I175) | =V$137+V$135*SIN*SIN($I175) |

FIG. 23

| | Y | Z | AA | AB | AC |
|---|---|---|---|---|---|
| 138 | x | =AMz1aIJ109 | | x | =AMz1aIJ110 |
| 139 | =Y$136+Y$135*COS($I139) | =Y$137+Y$135*SIN($I139) | | =AB$136+AB$135*COS($I139) | =AB$137+AB$135*SIN($I139) |
| 140 | =Y$136+Y$135*COS($I140) | =Y$137+Y$135*SIN($I140) | | =AB$136+AB$135*COS($I140) | =AB$137+AB$135*SIN($I140) |
| 141 | =Y$136+Y$135*COS($I141) | =Y$137+Y$135*SIN($I141) | | =AB$136+AB$135*COS($I141) | =AB$137+AB$135*SIN($I141) |
| 142 | =Y$136+Y$135*COS($I142) | =Y$137+Y$135*SIN($I142) | | =AB$136+AB$135*COS($I142) | =AB$137+AB$135*SIN($I142) |
| 143 | =Y$136+Y$135*COS($I143) | =Y$137+Y$135*SIN($I143) | | =AB$136+AB$135*COS($I143) | =AB$137+AB$135*SIN($I143) |
| 144 | =Y$136+Y$135*COS($I144) | =Y$137+Y$135*SIN($I144) | | =AB$136+AB$135*COS($I144) | =AB$137+AB$135*SIN($I144) |
| 145 | =Y$136+Y$135*COS($I145) | =Y$137+Y$135*SIN($I145) | | =AB$136+AB$135*COS($I145) | =AB$137+AB$135*SIN($I145) |
| 146 | =Y$136+Y$135*COS($I146) | =Y$137+Y$135*SIN($I146) | | =AB$136+AB$135*COS($I146) | =AB$137+AB$135*SIN($I146) |
| 147 | =Y$136+Y$135*COS($I147) | =Y$137+Y$135*SIN($I147) | | =AB$136+AB$135*COS($I147) | =AB$137+AB$135*SIN($I147) |
| 148 | =Y$136+Y$135*COS($I148) | =Y$137+Y$135*SIN($I148) | | =AB$136+AB$135*COS($I148) | =AB$137+AB$135*SIN($I148) |
| 149 | =Y$136+Y$135*COS($I149) | =Y$137+Y$135*SIN($I149) | | =AB$136+AB$135*COS($I149) | =AB$137+AB$135*SIN($I149) |
| 150 | =Y$136+Y$135*COS($I150) | =Y$137+Y$135*SIN($I150) | | =AB$136+AB$135*COS($I150) | =AB$137+AB$135*SIN($I150) |
| 151 | =Y$136+Y$135*COS($I151) | =Y$137+Y$135*SIN($I151) | | =AB$136+AB$135*COS($I151) | =AB$137+AB$135*SIN($I151) |
| 152 | =Y$136+Y$135*COS($I152) | =Y$137+Y$135*SIN($I152) | | =AB$136+AB$135*COS($I152) | =AB$137+AB$135*SIN($I152) |
| 153 | =Y$136+Y$135*COS($I153) | =Y$137+Y$135*SIN($I153) | | =AB$136+AB$135*COS($I153) | =AB$137+AB$135*SIN($I153) |
| 154 | =Y$136+Y$135*COS($I154) | =Y$137+Y$135*SIN($I154) | | =AB$136+AB$135*COS($I154) | =AB$137+AB$135*SIN($I154) |
| 155 | =Y$136+Y$135*COS($I155) | =Y$137+Y$135*SIN($I155) | | =AB$136+AB$135*COS($I155) | =AB$137+AB$135*SIN($I155) |
| 156 | =Y$136+Y$135*COS($I156) | =Y$137+Y$135*SIN($I156) | | =AB$136+AB$135*COS($I156) | =AB$137+AB$135*SIN($I156) |
| 157 | =Y$136+Y$135*COS($I157) | =Y$137+Y$135*SIN($I157) | | =AB$136+AB$135*COS($I157) | =AB$137+AB$135*SIN($I157) |
| 158 | =Y$136+Y$135*COS($I158) | =Y$137+Y$135*SIN($I158) | | =AB$136+AB$135*COS($I158) | =AB$137+AB$135*SIN($I158) |
| 159 | =Y$136+Y$135*COS($I159) | =Y$137+Y$135*SIN($I159) | | =AB$136+AB$135*COS($I159) | =AB$137+AB$135*SIN($I159) |
| 160 | =Y$136+Y$135*COS($I160) | =Y$137+Y$135*SIN($I160) | | =AB$136+AB$135*COS($I160) | =AB$137+AB$135*SIN($I160) |
| 161 | =Y$136+Y$135*COS($I161) | =Y$137+Y$135*SIN($I161) | | =AB$136+AB$135*COS($I161) | =AB$137+AB$135*SIN($I161) |
| 162 | =Y$136+Y$135*COS($I162) | =Y$137+Y$135*SIN($I162) | | =AB$136+AB$135*COS($I162) | =AB$137+AB$135*SIN($I162) |
| 163 | =Y$136+Y$135*COS($I163) | =Y$137+Y$135*SIN($I163) | | =AB$136+AB$135*COS($I163) | =AB$137+AB$135*SIN($I163) |
| 164 | =Y$136+Y$135*COS($I164) | =Y$137+Y$135*SIN($I164) | | =AB$136+AB$135*COS($I164) | =AB$137+AB$135*SIN($I164) |
| 165 | =Y$136+Y$135*COS($I165) | =Y$137+Y$135*SIN($I165) | | =AB$136+AB$135*COS($I165) | =AB$137+AB$135*SIN($I165) |
| 166 | =Y$136+Y$135*COS($I166) | =Y$137+Y$135*SIN($I166) | | =AB$136+AB$135*COS($I166) | =AB$137+AB$135*SIN($I166) |
| 167 | =Y$136+Y$135*COS($I167) | =Y$137+Y$135*SIN($I167) | | =AB$136+AB$135*COS($I167) | =AB$137+AB$135*SIN($I167) |
| 168 | =Y$136+Y$135*COS($I168) | =Y$137+Y$135*SIN($I168) | | =AB$136+AB$135*COS($I168) | =AB$137+AB$135*SIN($I168) |
| 169 | =Y$136+Y$135*COS($I169) | =Y$137+Y$135*SIN($I169) | | =AB$136+AB$135*COS($I169) | =AB$137+AB$135*SIN($I169) |
| 170 | =Y$136+Y$135*COS($I170) | =Y$137+Y$135*SIN($I170) | | =AB$136+AB$135*COS($I170) | =AB$137+AB$135*SIN($I170) |
| 171 | =Y$136+Y$135*COS($I171) | =Y$137+Y$135*SIN($I171) | | =AB$136+AB$135*COS($I171) | =AB$137+AB$135*SIN($I171) |
| 172 | =Y$136+Y$135*COS($I172) | =Y$137+Y$135*SIN($I172) | | =AB$136+AB$135*COS($I172) | =AB$137+AB$135*SIN($I172) |
| 173 | =Y$136+Y$135*COS($I173) | =Y$137+Y$135*SIN($I173) | | =AB$136+AB$135*COS($I173) | =AB$137+AB$135*SIN($I173) |
| 174 | =Y$136+Y$135*COS($I174) | =Y$137+Y$135*SIN($I174) | | =AB$136+AB$135*COS($I174) | =AB$137+AB$135*SIN($I174) |
| 175 | =Y$136+Y$135*COS($I175) | =Y$137+Y$135*SIN($I175) | | =AB$136+AB$135*COS($I175) | =AB$137+AB$135*SIN($I175) |

FIG. 24

| | AD | AE | AF | AG |
|---|---|---|---|---|
| 138 | x | =AMz1aIJ111 | x | =AMz1aIJ112 |
| 139 | =AD$136+AD$135*COS($I139) | =AD$137+AD$135*SIN($I139) | =AF$136+AF$135*COS($I139) | =AF$137+AF$135*SIN($I139) |
| 140 | =AD$136+AD$135*COS($I140) | =AD$137+AD$135*SIN($I140) | =AF$136+AF$135*COS($I140) | =AF$137+AF$135*SIN($I140) |
| 141 | =AD$136+AD$135*COS($I141) | =AD$137+AD$135*SIN($I141) | =AF$136+AF$135*COS($I141) | =AF$137+AF$135*SIN($I141) |
| 142 | =AD$136+AD$135*COS($I142) | =AD$137+AD$135*SIN($I142) | =AF$136+AF$135*COS($I142) | =AF$137+AF$135*SIN($I142) |
| 143 | =AD$136+AD$135*COS($I143) | =AD$137+AD$135*SIN($I143) | =AF$136+AF$135*COS($I143) | =AF$137+AF$135*SIN($I143) |
| 144 | =AD$136+AD$135*COS($I144) | =AD$137+AD$135*SIN($I144) | =AF$136+AF$135*COS($I144) | =AF$137+AF$135*SIN($I144) |
| 145 | =AD$136+AD$135*COS($I145) | =AD$137+AD$135*SIN($I145) | =AF$136+AF$135*COS($I145) | =AF$137+AF$135*SIN($I145) |
| 146 | =AD$136+AD$135*COS($I146) | =AD$137+AD$135*SIN($I146) | =AF$136+AF$135*COS($I146) | =AF$137+AF$135*SIN($I146) |
| 147 | =AD$136+AD$135*COS($I147) | =AD$137+AD$135*SIN($I147) | =AF$136+AF$135*COS($I147) | =AF$137+AF$135*SIN($I147) |
| 148 | =AD$136+AD$135*COS($I148) | =AD$137+AD$135*SIN($I148) | =AF$136+AF$135*COS($I148) | =AF$137+AF$135*SIN($I148) |
| 149 | =AD$136+AD$135*COS($I149) | =AD$137+AD$135*SIN($I149) | =AF$136+AF$135*COS($I149) | =AF$137+AF$135*SIN($I149) |
| 150 | =AD$136+AD$135*COS($I150) | =AD$137+AD$135*SIN($I150) | =AF$136+AF$135*COS($I150) | =AF$137+AF$135*SIN($I150) |
| 151 | =AD$136+AD$135*COS($I151) | =AD$137+AD$135*SIN($I151) | =AF$136+AF$135*COS($I151) | =AF$137+AF$135*SIN($I151) |
| 152 | =AD$136+AD$135*COS($I152) | =AD$137+AD$135*SIN($I152) | =AF$136+AF$135*COS($I152) | =AF$137+AF$135*SIN($I152) |
| 153 | =AD$136+AD$135*COS($I153) | =AD$137+AD$135*SIN($I153) | =AF$136+AF$135*COS($I153) | =AF$137+AF$135*SIN($I153) |
| 154 | =AD$136+AD$135*COS($I154) | =AD$137+AD$135*SIN($I154) | =AF$136+AF$135*COS($I154) | =AF$137+AF$135*SIN($I154) |
| 155 | =AD$136+AD$135*COS($I155) | =AD$137+AD$135*SIN($I155) | =AF$136+AF$135*COS($I155) | =AF$137+AF$135*SIN($I155) |
| 156 | =AD$136+AD$135*COS($I156) | =AD$137+AD$135*SIN($I156) | =AF$136+AF$135*COS($I156) | =AF$137+AF$135*SIN($I156) |
| 157 | =AD$136+AD$135*COS($I157) | =AD$137+AD$135*SIN($I157) | =AF$136+AF$135*COS($I157) | =AF$137+AF$135*SIN($I157) |
| 158 | =AD$136+AD$135*COS($I158) | =AD$137+AD$135*SIN($I158) | =AF$136+AF$135*COS($I158) | =AF$137+AF$135*SIN($I158) |
| 159 | =AD$136+AD$135*COS($I159) | =AD$137+AD$135*SIN($I159) | =AF$136+AF$135*COS($I159) | =AF$137+AF$135*SIN($I159) |
| 160 | =AD$136+AD$135*COS($I160) | =AD$137+AD$135*SIN($I160) | =AF$136+AF$135*COS($I160) | =AF$137+AF$135*SIN($I160) |
| 161 | =AD$136+AD$135*COS($I161) | =AD$137+AD$135*SIN($I161) | =AF$136+AF$135*COS($I161) | =AF$137+AF$135*SIN($I161) |
| 162 | =AD$136+AD$135*COS($I162) | =AD$137+AD$135*SIN($I162) | =AF$136+AF$135*COS($I162) | =AF$137+AF$135*SIN($I162) |
| 163 | =AD$136+AD$135*COS($I163) | =AD$137+AD$135*SIN($I163) | =AF$136+AF$135*COS($I163) | =AF$137+AF$135*SIN($I163) |
| 164 | =AD$136+AD$135*COS($I164) | =AD$137+AD$135*SIN($I164) | =AF$136+AF$135*COS($I164) | =AF$137+AF$135*SIN($I164) |
| 165 | =AD$136+AD$135*COS($I165) | =AD$137+AD$135*SIN($I165) | =AF$136+AF$135*COS($I165) | =AF$137+AF$135*SIN($I165) |
| 166 | =AD$136+AD$135*COS($I166) | =AD$137+AD$135*SIN($I166) | =AF$136+AF$135*COS($I166) | =AF$137+AF$135*SIN($I166) |
| 167 | =AD$136+AD$135*COS($I167) | =AD$137+AD$135*SIN($I167) | =AF$136+AF$135*COS($I167) | =AF$137+AF$135*SIN($I167) |
| 168 | =AD$136+AD$135*COS($I168) | =AD$137+AD$135*SIN($I168) | =AF$136+AF$135*COS($I168) | =AF$137+AF$135*SIN($I168) |
| 169 | =AD$136+AD$135*COS($I169) | =AD$137+AD$135*SIN($I169) | =AF$136+AF$135*COS($I169) | =AF$137+AF$135*SIN($I169) |
| 170 | =AD$136+AD$135*COS($I170) | =AD$137+AD$135*SIN($I170) | =AF$136+AF$135*COS($I170) | =AF$137+AF$135*SIN($I170) |
| 171 | =AD$136+AD$135*COS($I171) | =AD$137+AD$135*SIN($I171) | =AF$136+AF$135*COS($I171) | =AF$137+AF$135*SIN($I171) |
| 172 | =AD$136+AD$135*COS($I172) | =AD$137+AD$135*SIN($I172) | =AF$136+AF$135*COS($I172) | =AF$137+AF$135*SIN($I172) |
| 173 | =AD$136+AD$135*COS($I173) | =AD$137+AD$135*SIN($I173) | =AF$136+AF$135*COS($I173) | =AF$137+AF$135*SIN($I173) |
| 174 | =AD$136+AD$135*COS($I174) | =AD$137+AD$135*SIN($I174) | =AF$136+AF$135*COS($I174) | =AF$137+AF$135*SIN($I174) |
| 175 | =AD$136+AD$135*COS($I175) | =AD$137+AD$135*SIN($I175) | =AF$136+AF$135*COS($I175) | =AF$137+AF$135*SIN($I175) |

|     | AL | AM | AN | AO |
|-----|----|----|----|----|
|     | x  | =AMz1aIJ115 | x | =AMz1aIJ116 |
| 138 |    |    |    |    |
| 139 | =AL$136+AL$135*COS($I139) | =AL$137+AL$135*SIN($I139) | =AN$136+AN$135*COS($I139) | =AN$137+AN$135*SIN($I139) |
| 140 | =AL$136+AL$135*COS($I140) | =AL$137+AL$135*SIN($I140) | =AN$136+AN$135*COS($I140) | =AN$137+AN$135*SIN($I140) |
| 141 | =AL$136+AL$135*COS($I141) | =AL$137+AL$135*SIN($I141) | =AN$136+AN$135*COS($I141) | =AN$137+AN$135*SIN($I141) |
| 142 | =AL$136+AL$135*COS($I142) | =AL$137+AL$135*SIN($I142) | =AN$136+AN$135*COS($I142) | =AN$137+AN$135*SIN($I142) |
| 143 | =AL$136+AL$135*COS($I143) | =AL$137+AL$135*SIN($I143) | =AN$136+AN$135*COS($I143) | =AN$137+AN$135*SIN($I143) |
| 144 | =AL$136+AL$135*COS($I144) | =AL$137+AL$135*SIN($I144) | =AN$136+AN$135*COS($I144) | =AN$137+AN$135*SIN($I144) |
| 145 | =AL$136+AL$135*COS($I145) | =AL$137+AL$135*SIN($I145) | =AN$136+AN$135*COS($I145) | =AN$137+AN$135*SIN($I145) |
| 146 | =AL$136+AL$135*COS($I146) | =AL$137+AL$135*SIN($I146) | =AN$136+AN$135*COS($I146) | =AN$137+AN$135*SIN($I146) |
| 147 | =AL$136+AL$135*COS($I147) | =AL$137+AL$135*SIN($I147) | =AN$136+AN$135*COS($I147) | =AN$137+AN$135*SIN($I147) |
| 148 | =AL$136+AL$135*COS($I148) | =AL$137+AL$135*SIN($I148) | =AN$136+AN$135*COS($I148) | =AN$137+AN$135*SIN($I148) |
| 149 | =AL$136+AL$135*COS($I149) | =AL$137+AL$135*SIN($I149) | =AN$136+AN$135*COS($I149) | =AN$137+AN$135*SIN($I149) |
| 150 | =AL$136+AL$135*COS($I150) | =AL$137+AL$135*SIN($I150) | =AN$136+AN$135*COS($I150) | =AN$137+AN$135*SIN($I150) |
| 151 | =AL$136+AL$135*COS($I151) | =AL$137+AL$135*SIN($I151) | =AN$136+AN$135*COS($I151) | =AN$137+AN$135*SIN($I151) |
| 152 | =AL$136+AL$135*COS($I152) | =AL$137+AL$135*SIN($I152) | =AN$136+AN$135*COS($I152) | =AN$137+AN$135*SIN($I152) |
| 153 | =AL$136+AL$135*COS($I153) | =AL$137+AL$135*SIN($I153) | =AN$136+AN$135*COS($I153) | =AN$137+AN$135*SIN($I153) |
| 154 | =AL$136+AL$135*COS($I154) | =AL$137+AL$135*SIN($I154) | =AN$136+AN$135*COS($I154) | =AN$137+AN$135*SIN($I154) |
| 155 | =AL$136+AL$135*COS($I155) | =AL$137+AL$135*SIN($I155) | =AN$136+AN$135*COS($I155) | =AN$137+AN$135*SIN($I155) |
| 156 | =AL$136+AL$135*COS($I156) | =AL$137+AL$135*SIN($I156) | =AN$136+AN$135*COS($I156) | =AN$137+AN$135*SIN($I156) |
| 157 | =AL$136+AL$135*COS($I157) | =AL$137+AL$135*SIN($I157) | =AN$136+AN$135*COS($I157) | =AN$137+AN$135*SIN($I157) |
| 158 | =AL$136+AL$135*COS($I158) | =AL$137+AL$135*SIN($I158) | =AN$136+AN$135*COS($I158) | =AN$137+AN$135*SIN($I158) |
| 159 | =AL$136+AL$135*COS($I159) | =AL$137+AL$135*SIN($I159) | =AN$136+AN$135*COS($I159) | =AN$137+AN$135*SIN($I159) |
| 160 | =AL$136+AL$135*COS($I160) | =AL$137+AL$135*SIN($I160) | =AN$136+AN$135*COS($I160) | =AN$137+AN$135*SIN($I160) |
| 161 | =AL$136+AL$135*COS($I161) | =AL$137+AL$135*SIN($I161) | =AN$136+AN$135*COS($I161) | =AN$137+AN$135*SIN($I161) |
| 162 | =AL$136+AL$135*COS($I162) | =AL$137+AL$135*SIN($I162) | =AN$136+AN$135*COS($I162) | =AN$137+AN$135*SIN($I162) |
| 163 | =AL$136+AL$135*COS($I163) | =AL$137+AL$135*SIN($I163) | =AN$136+AN$135*COS($I163) | =AN$137+AN$135*SIN($I163) |
| 164 | =AL$136+AL$135*COS($I164) | =AL$137+AL$135*SIN($I164) | =AN$136+AN$135*COS($I164) | =AN$137+AN$135*SIN($I164) |
| 165 | =AL$136+AL$135*COS($I165) | =AL$137+AL$135*SIN($I165) | =AN$136+AN$135*COS($I165) | =AN$137+AN$135*SIN($I165) |
| 166 | =AL$136+AL$135*COS($I166) | =AL$137+AL$135*SIN($I166) | =AN$136+AN$135*COS($I166) | =AN$137+AN$135*SIN($I166) |
| 167 | =AL$136+AL$135*COS($I167) | =AL$137+AL$135*SIN($I167) | =AN$136+AN$135*COS($I167) | =AN$137+AN$135*SIN($I167) |
| 168 | =AL$136+AL$135*COS($I168) | =AL$137+AL$135*SIN($I168) | =AN$136+AN$135*COS($I168) | =AN$137+AN$135*SIN($I168) |
| 169 | =AL$136+AL$135*COS($I169) | =AL$137+AL$135*SIN($I169) | =AN$136+AN$135*COS($I169) | =AN$137+AN$135*SIN($I169) |
| 170 | =AL$136+AL$135*COS($I170) | =AL$137+AL$135*SIN($I170) | =AN$136+AN$135*COS($I170) | =AN$137+AN$135*SIN($I170) |
| 171 | =AL$136+AL$135*COS($I171) | =AL$137+AL$135*SIN($I171) | =AN$136+AN$135*COS($I171) | =AN$137+AN$135*SIN($I171) |
| 172 | =AL$136+AL$135*COS($I172) | =AL$137+AL$135*SIN($I172) | =AN$136+AN$135*COS($I172) | =AN$137+AN$135*SIN($I172) |
| 173 | =AL$136+AL$135*COS($I173) | =AL$137+AL$135*SIN($I173) | =AN$136+AN$135*COS($I173) | =AN$137+AN$135*SIN($I173) |
| 174 | =AL$136+AL$135*COS($I174) | =AL$137+AL$135*SIN($I174) | =AN$136+AN$135*COS($I174) | =AN$137+AN$135*SIN($I174) |
| 175 | =AL$136+AL$135*COS($I175) | =AL$137+AL$135*SIN($I175) | =AN$136+AN$135*COS($I175) | =AN$137+AN$135*SIN($I175) |

FIG. 21

| | AP | AQ | AR | AS | AT | AU |
|---|---|---|---|---|---|---|
| | x | =AMz1aU117 | x | =AMz1aU118 | x | =AMz1aU119 |
| 138 | | | | | | |
| 139 | =AP$136+AP$135*COS($I139) | =AP$137+AP$135*SIN($I139) | =AR$136+AR$135*COS($I139) | =AR$137+AR$135*SIN($I139) | =AT$136+AT$135*COS($I139) | =AT$137+AT$135*SIN($I139) |
| 140 | =AP$136+AP$135*COS($I140) | =AP$137+AP$135*SIN($I140) | =AR$136+AR$135*COS($I140) | =AR$137+AR$135*SIN($I140) | =AT$136+AT$135*COS($I140) | =AT$137+AT$135*SIN($I140) |
| 141 | =AP$136+AP$135*COS($I141) | =AP$137+AP$135*SIN($I141) | =AR$136+AR$135*COS($I141) | =AR$137+AR$135*SIN($I141) | =AT$136+AT$135*COS($I141) | =AT$137+AT$135*SIN($I141) |
| 142 | =AP$136+AP$135*COS($I142) | =AP$137+AP$135*SIN($I142) | =AR$136+AR$135*COS($I142) | =AR$137+AR$135*SIN($I142) | =AT$136+AT$135*COS($I142) | =AT$137+AT$135*SIN($I142) |
| 143 | =AP$136+AP$135*COS($I143) | =AP$137+AP$135*SIN($I143) | =AR$136+AR$135*COS($I143) | =AR$137+AR$135*SIN($I143) | =AT$136+AT$135*COS($I143) | =AT$137+AT$135*SIN($I143) |
| 144 | =AP$136+AP$135*COS($I144) | =AP$137+AP$135*SIN($I144) | =AR$136+AR$135*COS($I144) | =AR$137+AR$135*SIN($I144) | =AT$136+AT$135*COS($I144) | =AT$137+AT$135*SIN($I144) |
| 145 | =AP$136+AP$135*COS($I145) | =AP$137+AP$135*SIN($I145) | =AR$136+AR$135*COS($I145) | =AR$137+AR$135*SIN($I145) | =AT$136+AT$135*COS($I145) | =AT$137+AT$135*SIN($I145) |
| 146 | =AP$136+AP$135*COS($I146) | =AP$137+AP$135*SIN($I146) | =AR$136+AR$135*COS($I146) | =AR$137+AR$135*SIN($I146) | =AT$136+AT$135*COS($I146) | =AT$137+AT$135*SIN($I146) |
| 147 | =AP$136+AP$135*COS($I147) | =AP$137+AP$135*SIN($I147) | =AR$136+AR$135*COS($I147) | =AR$137+AR$135*SIN($I147) | =AT$136+AT$135*COS($I147) | =AT$137+AT$135*SIN($I147) |
| 148 | =AP$136+AP$135*COS($I148) | =AP$137+AP$135*SIN($I148) | =AR$136+AR$135*COS($I148) | =AR$137+AR$135*SIN($I148) | =AT$136+AT$135*COS($I148) | =AT$137+AT$135*SIN($I148) |
| 149 | =AP$136+AP$135*COS($I149) | =AP$137+AP$135*SIN($I149) | =AR$136+AR$135*COS($I149) | =AR$137+AR$135*SIN($I149) | =AT$136+AT$135*COS($I149) | =AT$137+AT$135*SIN($I149) |
| 150 | =AP$136+AP$135*COS($I150) | =AP$137+AP$135*SIN($I150) | =AR$136+AR$135*COS($I150) | =AR$137+AR$135*SIN($I150) | =AT$136+AT$135*COS($I150) | =AT$137+AT$135*SIN($I150) |
| 151 | =AP$136+AP$135*COS($I151) | =AP$137+AP$135*SIN($I151) | =AR$136+AR$135*COS($I151) | =AR$137+AR$135*SIN($I151) | =AT$136+AT$135*COS($I151) | =AT$137+AT$135*SIN($I151) |
| 152 | =AP$136+AP$135*COS($I152) | =AP$137+AP$135*SIN($I152) | =AR$136+AR$135*COS($I152) | =AR$137+AR$135*SIN($I152) | =AT$136+AT$135*COS($I152) | =AT$137+AT$135*SIN($I152) |
| 153 | =AP$136+AP$135*COS($I153) | =AP$137+AP$135*SIN($I153) | =AR$136+AR$135*COS($I153) | =AR$137+AR$135*SIN($I153) | =AT$136+AT$135*COS($I153) | =AT$137+AT$135*SIN($I153) |
| 154 | =AP$136+AP$135*COS($I154) | =AP$137+AP$135*SIN($I154) | =AR$136+AR$135*COS($I154) | =AR$137+AR$135*SIN($I154) | =AT$136+AT$135*COS($I154) | =AT$137+AT$135*SIN($I154) |
| 155 | =AP$136+AP$135*COS($I155) | =AP$137+AP$135*SIN($I155) | =AR$136+AR$135*COS($I155) | =AR$137+AR$135*SIN($I155) | =AT$136+AT$135*COS($I155) | =AT$137+AT$135*SIN($I155) |
| 156 | =AP$136+AP$135*COS($I156) | =AP$137+AP$135*SIN($I156) | =AR$136+AR$135*COS($I156) | =AR$137+AR$135*SIN($I156) | =AT$136+AT$135*COS($I156) | =AT$137+AT$135*SIN($I156) |
| 157 | =AP$136+AP$135*COS($I157) | =AP$137+AP$135*SIN($I157) | =AR$136+AR$135*COS($I157) | =AR$137+AR$135*SIN($I157) | =AT$136+AT$135*COS($I157) | =AT$137+AT$135*SIN($I157) |
| 158 | =AP$136+AP$135*COS($I158) | =AP$137+AP$135*SIN($I158) | =AR$136+AR$135*COS($I158) | =AR$137+AR$135*SIN($I158) | =AT$136+AT$135*COS($I158) | =AT$137+AT$135*SIN($I158) |
| 159 | =AP$136+AP$135*COS($I159) | =AP$137+AP$135*SIN($I159) | =AR$136+AR$135*COS($I159) | =AR$137+AR$135*SIN($I159) | =AT$136+AT$135*COS($I159) | =AT$137+AT$135*SIN($I159) |
| 160 | =AP$136+AP$135*COS($I160) | =AP$137+AP$135*SIN($I160) | =AR$136+AR$135*COS($I160) | =AR$137+AR$135*SIN($I160) | =AT$136+AT$135*COS($I160) | =AT$137+AT$135*SIN($I160) |
| 161 | =AP$136+AP$135*COS($I161) | =AP$137+AP$135*SIN($I161) | =AR$136+AR$135*COS($I161) | =AR$137+AR$135*SIN($I161) | =AT$136+AT$135*COS($I161) | =AT$137+AT$135*SIN($I161) |
| 162 | =AP$136+AP$135*COS($I162) | =AP$137+AP$135*SIN($I162) | =AR$136+AR$135*COS($I162) | =AR$137+AR$135*SIN($I162) | =AT$136+AT$135*COS($I162) | =AT$137+AT$135*SIN($I162) |
| 163 | =AP$136+AP$135*COS($I163) | =AP$137+AP$135*SIN($I163) | =AR$136+AR$135*COS($I163) | =AR$137+AR$135*SIN($I163) | =AT$136+AT$135*COS($I163) | =AT$137+AT$135*SIN($I163) |
| 164 | =AP$136+AP$135*COS($I164) | =AP$137+AP$135*SIN($I164) | =AR$136+AR$135*COS($I164) | =AR$137+AR$135*SIN($I164) | =AT$136+AT$135*COS($I164) | =AT$137+AT$135*SIN($I164) |
| 165 | =AP$136+AP$135*COS($I165) | =AP$137+AP$135*SIN($I165) | =AR$136+AR$135*COS($I165) | =AR$137+AR$135*SIN($I165) | =AT$136+AT$135*COS($I165) | =AT$137+AT$135*SIN($I165) |
| 166 | =AP$136+AP$135*COS($I166) | =AP$137+AP$135*SIN($I166) | =AR$136+AR$135*COS($I166) | =AR$137+AR$135*SIN($I166) | =AT$136+AT$135*COS($I166) | =AT$137+AT$135*SIN($I166) |
| 167 | =AP$136+AP$135*COS($I167) | =AP$137+AP$135*SIN($I167) | =AR$136+AR$135*COS($I167) | =AR$137+AR$135*SIN($I167) | =AT$136+AT$135*COS($I167) | =AT$137+AT$135*SIN($I167) |
| 168 | =AP$136+AP$135*COS($I168) | =AP$137+AP$135*SIN($I168) | =AR$136+AR$135*COS($I168) | =AR$137+AR$135*SIN($I168) | =AT$136+AT$135*COS($I168) | =AT$137+AT$135*SIN($I168) |
| 169 | =AP$136+AP$135*COS($I169) | =AP$137+AP$135*SIN($I169) | =AR$136+AR$135*COS($I169) | =AR$137+AR$135*SIN($I169) | =AT$136+AT$135*COS($I169) | =AT$137+AT$135*SIN($I169) |
| 170 | =AP$136+AP$135*COS($I170) | =AP$137+AP$135*SIN($I170) | =AR$136+AR$135*COS($I170) | =AR$137+AR$135*SIN($I170) | =AT$136+AT$135*COS($I170) | =AT$137+AT$135*SIN($I170) |
| 171 | =AP$136+AP$135*COS($I171) | =AP$137+AP$135*SIN($I171) | =AR$136+AR$135*COS($I171) | =AR$137+AR$135*SIN($I171) | =AT$136+AT$135*COS($I171) | =AT$137+AT$135*SIN($I171) |
| 172 | =AP$136+AP$135*COS($I172) | =AP$137+AP$135*SIN($I172) | =AR$136+AR$135*COS($I172) | =AR$137+AR$135*SIN($I172) | =AT$136+AT$135*COS($I172) | =AT$137+AT$135*SIN($I172) |
| 173 | =AP$136+AP$135*COS($I173) | =AP$137+AP$135*SIN($I173) | =AR$136+AR$135*COS($I173) | =AR$137+AR$135*SIN($I173) | =AT$136+AT$135*COS($I173) | =AT$137+AT$135*SIN($I173) |
| 174 | =AP$136+AP$135*COS($I174) | =AP$137+AP$135*SIN($I174) | =AR$136+AR$135*COS($I174) | =AR$137+AR$135*SIN($I174) | =AT$136+AT$135*COS($I174) | =AT$137+AT$135*SIN($I174) |
| 175 | =AP$136+AP$135*COS($I175) | =AP$137+AP$135*SIN($I175) | =AR$136+AR$135*COS($I175) | =AR$137+AR$135*SIN($I175) | =AT$136+AT$135*COS($I175) | =AT$137+AT$135*SIN($I175) |

FIG. 28

| | I | J | K | L | M |
|---|---|---|---|---|---|
| 180 | CENTER TO CENTER DISTANCES (for plot and crosstalk calculations) | | | | |
| 181 | | | | | |
| 182 | | | Feature: | 1aBP | 1aV |
| 183 | Feature | x | x | =J184 | =J185 |
| | | y | y | =K184 | =K185 |
| 184 | 1aBP | =L102 | =M102 | =SQRT(($J184-L$182)^2+($K184-L$183)^2) | =SQRT(($J184-M$182)^2+($K184-M$183)^2) |
| 185 | 1aV | =L103 | =M103 | =SQRT(($J185-L$182)^2+($K185-L$183)^2) | =SQRT(($J185-M$182)^2+($K185-M$183)^2) |
| 186 | 1bBP | =L105 | =M105 | =SQRT(($J186-L$182)^2+($K186-L$183)^2) | =SQRT(($J186-M$182)^2+($K186-M$183)^2) |
| 187 | 1bV | =L106 | =M106 | =SQRT(($J187-L$182)^2+($K187-L$183)^2) | =SQRT(($J187-M$182)^2+($K187-M$183)^2) |
| 188 | 2aBP | =L108 | =M108 | =SQRT(($J188-L$182)^2+($K188-L$183)^2) | =SQRT(($J188-M$182)^2+($K188-M$183)^2) |
| 189 | 2aV | =L109 | =M109 | =SQRT(($J189-L$182)^2+($K189-L$183)^2) | =SQRT(($J189-M$182)^2+($K189-M$183)^2) |
| 190 | 2bBP | =L111 | =M111 | =SQRT(($J190-L$182)^2+($K190-L$183)^2) | =SQRT(($J190-M$182)^2+($K190-M$183)^2) |
| 191 | 2bV | =L112 | =M112 | =SQRT(($J191-L$182)^2+($K191-L$183)^2) | =SQRT(($J191-M$182)^2+($K191-M$183)^2) |
| 192 | 3aBP | =L114 | =M114 | =SQRT(($J192-L$182)^2+($K192-L$183)^2) | =SQRT(($J192-M$182)^2+($K192-M$183)^2) |
| 193 | 3aV | =L115 | =M115 | =SQRT(($J193-L$182)^2+($K193-L$183)^2) | =SQRT(($J193-M$182)^2+($K193-M$183)^2) |
| 194 | 3bBP | =L117 | =M117 | =SQRT(($J194-L$182)^2+($K194-L$183)^2) | =SQRT(($J194-M$182)^2+($K194-M$183)^2) |
| 195 | 3bV | =L118 | =M118 | =SQRT(($J195-L$182)^2+($K195-L$183)^2) | =SQRT(($J195-M$182)^2+($K195-M$183)^2) |

FIG. 29

| | N | O | P | Q |
|---|---|---|---|---|
| 179 | | | | |
| 180 | 1bBP | 1bV | 2aBP | 2aV |
| 181 | | | | |
| 182 | =J186 | =J187 | =J188 | =J189 |
| 183 | =K186 | =K187 | =K188 | =K189 |
| 184 | =SQRT(($J184-N$182)^2+($K184-N$183)^2) | =SQRT(($J184-O$182)^2+($K184-O$183)^2) | =SQRT(($J184-P$182)^2+($K184-P$183)^2) | =SQRT(($J184-Q$182)^2+($K184-Q$183)^2) |
| 185 | =SQRT(($J185-N$182)^2+($K185-N$183)^2) | =SQRT(($J185-O$182)^2+($K185-O$183)^2) | =SQRT(($J185-P$182)^2+($K185-P$183)^2) | =SQRT(($J185-Q$182)^2+($K185-Q$183)^2) |
| 186 | =SQRT(($J186-N$182)^2+($K186-N$183)^2) | =SQRT(($J186-O$182)^2+($K186-O$183)^2) | =SQRT(($J186-P$182)^2+($K186-P$183)^2) | =SQRT(($J186-Q$182)^2+($K186-Q$183)^2) |
| 187 | =SQRT(($J187-N$182)^2+($K187-N$183)^2) | =SQRT(($J187-O$182)^2+($K187-O$183)^2) | =SQRT(($J187-P$182)^2+($K187-P$183)^2) | =SQRT(($J187-Q$182)^2+($K187-Q$183)^2) |
| 188 | =SQRT(($J188-N$182)^2+($K188-N$183)^2) | =SQRT(($J188-O$182)^2+($K188-O$183)^2) | =SQRT(($J188-P$182)^2+($K188-P$183)^2) | =SQRT(($J188-Q$182)^2+($K188-Q$183)^2) |
| 189 | =SQRT(($J189-N$182)^2+($K189-N$183)^2) | =SQRT(($J189-O$182)^2+($K189-O$183)^2) | =SQRT(($J189-P$182)^2+($K189-P$183)^2) | =SQRT(($J189-Q$182)^2+($K189-Q$183)^2) |
| 190 | =SQRT(($J190-N$182)^2+($K190-N$183)^2) | =SQRT(($J190-O$182)^2+($K190-O$183)^2) | =SQRT(($J190-P$182)^2+($K190-P$183)^2) | =SQRT(($J190-Q$182)^2+($K190-Q$183)^2) |
| 191 | =SQRT(($J191-N$182)^2+($K191-N$183)^2) | =SQRT(($J191-O$182)^2+($K191-O$183)^2) | =SQRT(($J191-P$182)^2+($K191-P$183)^2) | =SQRT(($J191-Q$182)^2+($K191-Q$183)^2) |
| 192 | =SQRT(($J192-N$182)^2+($K192-N$183)^2) | =SQRT(($J192-O$182)^2+($K192-O$183)^2) | =SQRT(($J192-P$182)^2+($K192-P$183)^2) | =SQRT(($J192-Q$182)^2+($K192-Q$183)^2) |
| 193 | =SQRT(($J193-N$182)^2+($K193-N$183)^2) | =SQRT(($J193-O$182)^2+($K193-O$183)^2) | =SQRT(($J193-P$182)^2+($K193-P$183)^2) | =SQRT(($J193-Q$182)^2+($K193-Q$183)^2) |
| 194 | =SQRT(($J194-N$182)^2+($K194-N$183)^2) | =SQRT(($J194-O$182)^2+($K194-O$183)^2) | =SQRT(($J194-P$182)^2+($K194-P$183)^2) | =SQRT(($J194-Q$182)^2+($K194-Q$183)^2) |
| 195 | =SQRT(($J195-N$182)^2+($K195-N$183)^2) | =SQRT(($J195-O$182)^2+($K195-O$183)^2) | =SQRT(($J195-P$182)^2+($K195-P$183)^2) | =SQRT(($J195-Q$182)^2+($K195-Q$183)^2) |

FIG. 30

|     | R | S | T | U |
|-----|---|---|---|---|
|     | 2bBP | 2bV | 3aBP | 3aV |
| 181 |  |  |  |  |
| 182 | =J190 | =J191 | =J192 | =J193 |
| 183 | =K190 | =K191 | =K192 | =K193 |
| 184 | =SQRT(($J184-R$182)^2+($K184-R$183)^2) | =SQRT(($J184-S$182)^2+($K184-S$183)^2) | =SQRT(($J184-T$182)^2+($K184-T$183)^2) | =SQRT(($J184-U$182)^2+($K184-U$183)^2) |
| 185 | =SQRT(($J185-R$182)^2+($K185-R$183)^2) | =SQRT(($J185-S$182)^2+($K185-S$183)^2) | =SQRT(($J185-T$182)^2+($K185-T$183)^2) | =SQRT(($J185-U$182)^2+($K185-U$183)^2) |
| 186 | =SQRT(($J186-R$182)^2+($K186-R$183)^2) | =SQRT(($J186-S$182)^2+($K186-S$183)^2) | =SQRT(($J186-T$182)^2+($K186-T$183)^2) | =SQRT(($J186-U$182)^2+($K186-U$183)^2) |
| 187 | =SQRT(($J187-R$182)^2+($K187-R$183)^2) | =SQRT(($J187-S$182)^2+($K187-S$183)^2) | =SQRT(($J187-T$182)^2+($K187-T$183)^2) | =SQRT(($J187-U$182)^2+($K187-U$183)^2) |
| 188 | =SQRT(($J188-R$182)^2+($K188-R$183)^2) | =SQRT(($J188-S$182)^2+($K188-S$183)^2) | =SQRT(($J188-T$182)^2+($K188-T$183)^2) | =SQRT(($J188-U$182)^2+($K188-U$183)^2) |
| 189 | =SQRT(($J189-R$182)^2+($K189-R$183)^2) | =SQRT(($J189-S$182)^2+($K189-S$183)^2) | =SQRT(($J189-T$182)^2+($K189-T$183)^2) | =SQRT(($J189-U$182)^2+($K189-U$183)^2) |
| 190 | =SQRT(($J190-R$182)^2+($K190-R$183)^2) | =SQRT(($J190-S$182)^2+($K190-S$183)^2) | =SQRT(($J190-T$182)^2+($K190-T$183)^2) | =SQRT(($J190-U$182)^2+($K190-U$183)^2) |
| 191 | =SQRT(($J191-R$182)^2+($K191-R$183)^2) | =SQRT(($J191-S$182)^2+($K191-S$183)^2) | =SQRT(($J191-T$182)^2+($K191-T$183)^2) | =SQRT(($J191-U$182)^2+($K191-U$183)^2) |
| 192 | =SQRT(($J192-R$182)^2+($K192-R$183)^2) | =SQRT(($J192-S$182)^2+($K192-S$183)^2) | =SQRT(($J192-T$182)^2+($K192-T$183)^2) | =SQRT(($J192-U$182)^2+($K192-U$183)^2) |
| 193 | =SQRT(($J193-R$182)^2+($K193-R$183)^2) | =SQRT(($J193-S$182)^2+($K193-S$183)^2) | =SQRT(($J193-T$182)^2+($K193-T$183)^2) | =SQRT(($J193-U$182)^2+($K193-U$183)^2) |
| 194 | =SQRT(($J194-R$182)^2+($K194-R$183)^2) | =SQRT(($J194-S$182)^2+($K194-S$183)^2) | =SQRT(($J194-T$182)^2+($K194-T$183)^2) | =SQRT(($J194-U$182)^2+($K194-U$183)^2) |
| 195 | =SQRT(($J195-R$182)^2+($K195-R$183)^2) | =SQRT(($J195-S$182)^2+($K195-S$183)^2) | =SQRT(($J195-T$182)^2+($K195-T$183)^2) | =SQRT(($J195-U$182)^2+($K195-U$183)^2) |

FIG. 31

| | V | W |
|---|---|---|
| 181 | 3bBP | 3bV |
| 182 | =J194 | =J195 |
| 183 | =K194 | =K195 |
| 184 | =SQRT(($J184-V$182)^2+($K184-V$183)^2) | =SQRT(($J184-W$182)^2+($K184-W$183)^2) |
| 185 | =SQRT(($J185-V$182)^2+($K185-V$183)^2) | =SQRT(($J185-W$182)^2+($K185-W$183)^2) |
| 186 | =SQRT(($J186-V$182)^2+($K186-V$183)^2) | =SQRT(($J186-W$182)^2+($K186-W$183)^2) |
| 187 | =SQRT(($J187-V$182)^2+($K187-V$183)^2) | =SQRT(($J187-W$182)^2+($K187-W$183)^2) |
| 188 | =SQRT(($J188-V$182)^2+($K188-V$183)^2) | =SQRT(($J188-W$182)^2+($K188-W$183)^2) |
| 189 | =SQRT(($J189-V$182)^2+($K189-V$183)^2) | =SQRT(($J189-W$182)^2+($K189-W$183)^2) |
| 190 | =SQRT(($J190-V$182)^2+($K190-V$183)^2) | =SQRT(($J190-W$182)^2+($K190-W$183)^2) |
| 191 | =SQRT(($J191-V$182)^2+($K191-V$183)^2) | =SQRT(($J191-W$182)^2+($K191-W$183)^2) |
| 192 | =SQRT(($J192-V$182)^2+($K192-V$183)^2) | =SQRT(($J192-W$182)^2+($K192-W$183)^2) |
| 193 | =SQRT(($J193-V$182)^2+($K193-V$183)^2) | =SQRT(($J193-W$182)^2+($K193-W$183)^2) |
| 194 | =SQRT(($J194-V$182)^2+($K194-V$183)^2) | =SQRT(($J194-W$182)^2+($K194-W$183)^2) |
| 195 | =SQRT(($J195-V$182)^2+($K195-V$183)^2) | =SQRT(($J195-W$182)^2+($K195-W$183)^2) |

| | C | D | E | F | G | H |
|---|---|---|---|---|---|---|
| 206 | | Pair Orientation | | | | |
| 207 | | | | | | |
| 208 | signal pair | y = yb — | | | | |
| 209 | | y = ya — | | | a — b | |
| 210 | | | | | | |
| 211 | | | | | | x = xa  x = xb |
| 212 | | y = yd — | | | | |
| 213 | Idle (quiet) pair | y = 0 — c | d | | | |
| 214 | | | | | | |
| 215 | | | x = 0  x = xd | | | |

FIG. 34

| | C | D | E | F |
|---|---|---|---|---|
| 217 | SYSTEM INPUT INFORMATION | | | |
| 218 | Voltage step | | 100 | mv |
| 219 | Risetime | | 2500 | ns |
| 220 | or Frequency | | 100 | MHz |
| 221 | Driver Char. Imped | Zo | 10 | ohm |
| 222 | Calc length | Lcalc | | in |
| 223 | SYSTEM CALCULATED VALUES | | | |
| 224 | Peak dI/dt | | dIdt | =$F$225/$E$221 |
| 225 | Peak dV/dt | | dVdt | =IF(E220=0,E218/E219,0.00 |

| | C | D | E | F | G |
|---|---|---|---|---|---|
| 227 | PAIR INPUT INFORMATION | | | Balls prs 1-2 | |
| 228 | Carry current? (1 or 0) | | cc | 1 | |
| 229 | Cond length | | L | =$G14*0.8 | mm |
| 230 | Conductor Diameter | | Dia | =$G14 | mm |
| 231 | Pair diel constant | | er | 1 | |
| 232 | signal a x-pos | | xa | =$J184 | mm |
| 233 | signal a y-pos | | ya | =$K184 | mm |
| 234 | signal b x-pos | | xb | =$J186 | mm |
| 235 | signal b y-pos | | yb | =$K186 | mm |
| 236 | idle c x-pos | | xc | =$J$188 | mm |
| 237 | idle c y-pos | | yc | =$K$188 | mm |
| 238 | idle d x-pos | | xd | =$J$190 | mm |
| 239 | idle d y-pos | | yd | =$K$190 | mm |
| 240 | Shield factor (1- & 2-over only) | | sf | 1 | |

FIG. 35

|  | I | J | K | L | M | N | O |
|---|---|---|---|---|---|---|---|
| 227 |  | Balls prs 1-3 | | | | Balls prs 2-3 | |
| 228 | cc |  |  |  | cc |  |  |
| 229 | L | =$G14*0.8 | mm |  | L | =$G14*0.8 | mm |
| 230 | Dia | =$G14 | mm |  | Dia | =$G14 | mm |
| 231 | er | 1 |  |  | er | 1 |  |
| 232 | xa | =$J184 | mm |  | xa | =$J$188 | mm |
| 233 | ya | =$K$184 | mm |  | ya | =$K$188 | mm |
| 234 | xb | =$J186 | mm |  | xb | =$J$190 | mm |
| 235 | yb | =$K$186 | mm |  | yb | =$K$190 | mm |
| 236 | xc | =J192 | mm |  | xc | =J192 | mm |
| 237 | yc | =K192 | mm |  | yc | =K192 | mm |
| 238 | xd | =J194 | mm |  | xd | =J194 | mm |
| 239 | yd | =K194 | mm |  | yd | =K194 | mm |
| 240 | sf | 1 |  |  | sf | 1 |  |

FIG. 36

| | Q | R | S | T | U | V | W | X | Y | Z | AA | AB | AC |
|---|---|---|---|---|---|---|---|---|---|---|---|---|---|
| 227 | | Vias prs 1-2 | | | | Vias prs 1-3 | | | | | | Vias prs 2-3 | |
| 228 | cc | 1 | | | cc | 1 | | | | cc | | 1 | |
| 229 | L | 1.6 | mm | | L | 1.6 | mm | | | L | | 1.6 | mm |
| 230 | Dia | =$G18 | mm | | Dia | =$G18 | mm | | | Dia | | =$G18 | mm |
| 231 | er | 4 | | | er | 4 | | | | er | | 4 | |
| 232 | xa | =J185 | mm | | xa | =J185 | mm | | | xa | | =J189 | mm |
| 233 | ya | =K185 | mm | | ya | =K185 | mm | | | ya | | =K189 | mm |
| 234 | xb | =J187 | mm | | xb | =J187 | mm | | | xb | | =J191 | mm |
| 235 | yb | =K187 | mm | | yb | =K187 | mm | | | yb | | =K191 | mm |
| 236 | xc | =J189 | mm | | xc | =J193 | mm | | | xc | | =J193 | mm |
| 237 | yc | =K189 | mm | | yc | =K193 | mm | | | yc | | =K193 | mm |
| 238 | xd | =J191 | mm | | xd | =J195 | mm | | | xd | | =J195 | mm |
| 239 | yd | =K191 | mm | | yd | =K195 | mm | | | yd | | =K195 | mm |
| 240 | sf | 1 | | | sf | 1 | | | | sf | | 1 | |

FIG. 37

| | C | D | E | F | G |
|---|---|---|---|---|---|
| 242 | CALCULATED VALUES | =E227 | | | |
| 243 | Cond length | | L | =F229/25.4 | in |
| 244 | Cond. effective dia. | | Dia | =F230/25.4 | in |
| 245 | signal a x-pos | | xa | =F232/25.4 | in |
| 246 | signal a y-pos | | ya | =F233/25.4 | in |
| 247 | signal b x-pos | | xb | =F234/25.4 | in |
| 248 | signal b y-pos | | yb | =F235/25.4 | in |
| 249 | idle c x-pos | | xc | =F236/25.4 | in |
| 250 | idle c y-pos | | yc | =F237/25.4 | in |
| 251 | idle d x-pos | | xd | =F238/25.4 | in |
| 252 | idle d y-pos | | yd | =F239/25.4 | in |
| 253 | Sac / Lcalc | | SacL | =SQRT((F245-F249)^2+(F246-F250)^2)/$E$222 | |
| 254 | Sbc / Lcalc | | SbcL | =SQRT((F247-F249)^2+(F248-F250)^2)/$E$222 | |
| 255 | Sad / Lcalc | | SadL | =SQRT((F245-F251)^2+(F246-F252)^2)/$E$222 | |
| 256 | Sbd / Lcalc | | SbdL | =SQRT((F247-F251)^2+(F248-F252)^2)/$E$222 | |
| 257 | Mutual Inductance term | | Rac | =LN(1/F253+SQRT(1+(1/F253)^2))-SQRT(1+(F253)^2)+F253 | |
| 258 | Mutual Inductance term | | Rbc | =LN(1/F254+SQRT(1+(1/F254)^2))-SQRT(1+(F254)^2)+F254 | |
| 259 | Mutual Inductance term | | Rad | =LN(1/F255+SQRT(1+(1/F255)^2))-SQRT(1+(F255)^2)+F255 | |
| 260 | Mutual Inductance term | | Rbd | =LN(1/F256+SQRT(1+(1/F256)^2))-SQRT(1+(F256)^2)+F256 | |
| 261 | Pair to pair mutual inductance | | Mpp | =5*(F257+F260-F258-F259) | nh/in |
| 262 | Pair to pair capacitance | | Cpp | =0.35*$F$231*LN((F255*F254)/(F253*F256))/(LN(SQRT((F247-F245)^2+(F248-F246)^2)*2/F244)*LN(SQRT((F251-F249)^2+(F252-F250)^2)*2/F244)) | pf / in |
| 263 | Ind X-talk contribution | | NEXT_L | =($F$224/2)*F261*F243*F228 | mv |
| 264 | Cap X-talk contribution | | NEXT_C | =($F$225/2)*$E$221*F262*10^-3*F243 | mv |
| 265 | Total NE X-talk contribution | | NEXT | =F263+F264 | mv |
| 266 | Total NE X-talk isolation | | NEXTdB | =20*LOG(ABS($E218/F265)) | dB |

FIG. 38

| H | I | J | K |
|---|---|---|---|
| 242 =I227 | | | |
| 243 | L | =J229/25.4 | in |
| 244 | Dia | =J230/25.4 | in |
| 245 | xa | =J232/25.4 | in |
| 246 | ya | =J233/25.4 | in |
| 247 | xb | =J234/25.4 | in |
| 248 | yb | =J235/25.4 | in |
| 249 | xc | =J236/25.4 | in |
| 250 | yc | =J237/25.4 | in |
| 251 | xd | =J238/25.4 | in |
| 252 | yd | =J239/25.4 | in |
| 253 | SacL | =SQRT((J245-J249)^2+(J246-J250)^2)/$E$222 | |
| 254 | SbcL | =SQRT((J247-J249)^2+(J248-J250)^2)/$E$222 | |
| 255 | SadL | =SQRT((J245-J251)^2+(J246-J252)^2)/$E$222 | |
| 256 | SbdL | =SQRT((J247-J251)^2+(J248-J252)^2)/$E$222 | |
| 257 | Rac | =LN(1/J253+SQRT(1+(1/J253)^2))-SQRT(1+(J253)^2)+J253 | |
| 258 | Rbc | =LN(1/J254+SQRT(1+(1/J254)^2))-SQRT(1+(J254)^2)+J254 | |
| 259 | Rad | =LN(1/J255+SQRT(1+(1/J255)^2))-SQRT(1+(J255)^2)+J255 | |
| 260 | Rbd | =LN(1/J256+SQRT(1+(1/J256)^2))-SQRT(1+(J256)^2)+J256 | |
| 261 | Mpp | =5*(J257+J260-J258-J259) | nh/in |
| 262 | Cpp | =0.35*$F$231*LN(((J255*J254)/(J253*J256))/(LN(SQRT(((J247-J245)^2+(J248-J246)^2)^2)/J244)*LN(SQRT(((J251-J249)^2+(J252-J250)^2)^2)/J244)) | pf / in |
| 263 | NEXT_L | =($F$224/2)*J261*J243*J228 | mv |
| 264 | NEXT_C | =($F$225/2)*$E$221*J262*10^-3*J243 | mv |
| 265 | NEXT | =J263+J264 | mv |
| 266 | NEXTdB | =20*LOG(ABS($E$218/J265)) | dB |

FIG. 39

| | L | M | N | O |
|---|---|---|---|---|
| 242 | =M227 | | | |
| 243 | | L | =N229/25.4 | in |
| 244 | | Dia | =N230/25.4 | in |
| 245 | | xa | =N232/25.4 | in |
| 246 | | ya | =N233/25.4 | in |
| 247 | | xb | =N234/25.4 | in |
| 248 | | yb | =N235/25.4 | in |
| 249 | | xc | =N236/25.4 | in |
| 250 | | yc | =N237/25.4 | in |
| 251 | | xd | =N238/25.4 | in |
| 252 | | yd | =N239/25.4 | in |
| 253 | | SacL | =SQRT((N245-N249)^2+(N246-N250)^2)/$E$222 | |
| 254 | | SbcL | =SQRT((N247-N249)^2+(N248-N250)^2)/$E$222 | |
| 255 | | SadL | =SQRT((N245-N251)^2+(N246-N252)^2)/$E$222 | |
| 256 | | SbdL | =SQRT((N247-N251)^2+(N248-N252)^2)/$E$222 | |
| 257 | | Rac | =LN(1/N253+SQRT(1+(1/N253)^2))-SQRT(1+(N253)^2)+N253 | |
| 258 | | Rbc | =LN(1/N254+SQRT(1+(1/N254)^2))-SQRT(1+(N254)^2)+N254 | |
| 259 | | Rad | =LN(1/N255+SQRT(1+(1/N255)^2))-SQRT(1+(N255)^2)+N255 | |
| 260 | | Rbd | =LN(1/N256+SQRT(1+(1/N256)^2))-SQRT(1+(N256)^2)+N256 | |
| 261 | | Mpp | =5*(N257+N260-N258-N259) | nh/in |
| 262 | | Cpp | =0.35*$F$231*LN((N253*N254)/(N255*N256))/(LN(SQRT((N251-N249)^2+(N252-N250)^2)/N244)*LN(SQRT((N247-N245)^2+(N248-N246)^2)/N244)) | pf / in |
| 263 | | NEXT_L | =($F$224/2)*N261*N243*N228 | mv |
| 264 | | NEXT_C | =($F$225/2)*$E$221*N262*10^-3*N243 | mv |
| 265 | | NEXT | =N263+N264 | mv |
| 266 | | NEXTdB | =20*LOG(ABS($E218/N265)) | dB |

FIG. 40

| | P | Q | R | S |
|---|---|---|---|---|
| 242 | =Q227 | | | |
| 243 | | L | =R229/25.4 | in |
| 244 | | Dia | =R230/25.4 | in |
| 245 | | xa | =R232/25.4 | in |
| 246 | | ya | =R233/25.4 | in |
| 247 | | xb | =R234/25.4 | in |
| 248 | | yb | =R235/25.4 | in |
| 249 | | xc | =R236/25.4 | in |
| 250 | | yc | =R237/25.4 | in |
| 251 | | xd | =R238/25.4 | in |
| 252 | | yd | =R239/25.4 | in |
| 253 | | SacL | =SQRT((R245-R249)^2+(R246-R250)^2)/$E$222 | |
| 254 | | SbcL | =SQRT((R247-R249)^2+(R248-R250)^2)/$E$222 | |
| 255 | | SadL | =SQRT((R245-R251)^2+(R246-R252)^2)/$E$222 | |
| 256 | | SbdL | =SQRT((R247-R251)^2+(R248-R252)^2)/$E$222 | |
| 257 | | Rac | =LN(1/R253+SQRT(1+(1/R253)^2))-SQRT(1+(R253)^2)+R253 | |
| 258 | | Rbc | =LN(1/R254+SQRT(1+(1/R254)^2))-SQRT(1+(R254)^2)+R254 | |
| 259 | | Rad | =LN(1/R255+SQRT(1+(1/R255)^2))-SQRT(1+(R255)^2)+R255 | |
| 260 | | Rbd | =LN(1/R256+SQRT(1+(1/R256)^2))-SQRT(1+(R256)^2)+R256 | |
| 261 | | Mpp | =5*(R257+R260-R258-R259) | nh/in |
| 262 | | Cpp | =0.35*$F$231*LN((R255*R254)/(R253*R256))/(LN(SQRT((R247-R245)^2+(R248-R246)^2)*2/R244)*LN(SQRT((R251-R249)^2+(R252-R250)^2)*2/R244)) | pf / in |
| 263 | | NEXT_L | =($F$224/2)*R261*R243*R228 | mv |
| 264 | | NEXT_C | =($F$225/2)*$E$221*R262*10^-3*R243 | mv |
| 265 | | NEXT | =R263+R264 | mv |
| 266 | | NEXTdB | =20*LOG(ABS($E$218/R265)) | dB |

FIG. 41

|   | T | U | V | W |
|---|---|---|---|---|
| 242 | =U227 | | | |
| 243 | | L | =V229/25.4 | in |
| 244 | | Dia | =V230/25.4 | in |
| 245 | | xa | =V232/25.4 | in |
| 246 | | ya | =V233/25.4 | in |
| 247 | | xb | =V234/25.4 | in |
| 248 | | yb | =V235/25.4 | in |
| 249 | | xc | =V236/25.4 | in |
| 250 | | yc | =V237/25.4 | in |
| 251 | | xd | =V238/25.4 | in |
| 252 | | yd | =V239/25.4 | in |
| 253 | | SacL | =SQRT((V245-V249)^2+(V246-V250)^2)/$E$222 | |
| 254 | | SbcL | =SQRT((V247-V249)^2+(V248-V250)^2)/$E$222 | |
| 255 | | SadL | =SQRT((V245-V251)^2+(V246-V252)^2)/$E$222 | |
| 256 | | SbdL | =SQRT((V247-V251)^2+(V248-V252)^2)/$E$222 | |
| 257 | | Rac | =LN(1/V253+SQRT(1+(1/V253)^2))-SQRT(1+(V253)^2)+V253 | |
| 258 | | Rbc | =LN(1/V254+SQRT(1+(1/V254)^2))-SQRT(1+(V254)^2)+V254 | |
| 259 | | Rad | =LN(1/V255+SQRT(1+(1/V255)^2))-SQRT(1+(V255)^2)+V255 | |
| 260 | | Rbd | =LN(1/V256+SQRT(1+(1/V256)^2))-SQRT(1+(V256)^2)+V256 | |
| 261 | | Mpp | =5*(V257+V260-V258-V259) | nh/in |
| 262 | | Cpp | =0.35*$F$231*LN((V255*V254)/(V253*V256))/(LN(SQRT((V247-V245)^2+(V248-V246)^2)*2/V244)*LN(SQRT((V251-V249)^2+(V252-V250)^2)*2/V244 | pf / in |
| 263 | | NEXT L | =($F$224/2)*V261*V243*V228 | mv |
| 264 | | NEXT C | =($F$225/2)*$E$221*V262*10^-3*V243 | mv |
| 265 | | NEXT | =V263+V264 | mv |
| 266 | | NEXTdB | =20*LOG(ABS($E218/V265)) | dB |

FIG. 42

| | Y | Z | AA | AB | AC |
|---|---|---|---|---|---|
| 242 | =Z227 | | | | |
| 243 | L | | | =AB229/25.4 | in |
| 244 | Dia | | | =AB230/25.4 | in |
| 245 | xa | | | =AB232/25.4 | in |
| 246 | ya | | | =AB233/25.4 | in |
| 247 | xb | | | =AB234/25.4 | in |
| 248 | yb | | | =AB235/25.4 | in |
| 249 | xc | | | =AB236/25.4 | in |
| 250 | yc | | | =AB237/25.4 | in |
| 251 | xd | | | =AB238/25.4 | in |
| 252 | yd | | | =AB239/25.4 | in |
| 253 | SacL | | | =SQRT((AB245-AB249)^2+(AB246-AB250)^2)/$E$222 | |
| 254 | SbcL | | | =SQRT((AB247-AB249)^2+(AB248-AB250)^2)/$E$222 | |
| 255 | SadL | | | =SQRT((AB245-AB251)^2+(AB246-AB252)^2)/$E$222 | |
| 256 | SbdL | | | =SQRT((AB247-AB251)^2+(AB248-AB252)^2)/$E$222 | |
| 257 | Rac | | | =LN(1/AB253+SQRT(1+(1/AB253)^2))-SQRT(1+(AB253)^2)+AB253 | |
| 258 | Rbc | | | =LN(1/AB254+SQRT(1+(1/AB254)^2))-SQRT(1+(AB254)^2)+AB254 | |
| 259 | Rad | | | =LN(1/AB255+SQRT(1+(1/AB255)^2))-SQRT(1+(AB255)^2)+AB255 | |
| 260 | Rbd | | | =LN(1/AB256+SQRT(1+(1/AB256)^2))-SQRT(1+(AB256)^2)+AB256 | |
| 261 | Mpp | | | =5*(AB257+AB260-AB258-AB259) | nh/in |
| 262 | Cpp | | | =0.35*$F$231*LN((AB255*AB254)/(AB253*AB256))-LN(SQRT((AB247-AB245)^2+(AB248-AB246)^2)/2/AB244)*LN(SQRT((AB251-AB249)^2+(AB252-AB250)^2)/2/AB244)) | pf / in |
| 263 | NEXT_L | | | =($F$224/2)*AB261*AB243*AB228 | mv |
| 264 | NEXT_C | | | =($F$225/2)*$E$221*AB262*10^-3*AB243 | mv |
| 265 | NEXT | | | =AB263+AB264 | mv |
| 266 | NEXTdB | | | =20*LOG(ABS($E$218/AB265)) | dB |

FIG. 43

| | D | E | F | G |
|---|---|---|---|---|
| | | | | Y-pos |
| | | X-pos | Y-pos | idle |
| | | | signals | |
| 268 | Set up plots of conductor p | | | |
| 269 | | | | |
| 270 | | | | |
| 271 | a | =F232 | =F233 | |
| 272 | b | =F234 | =F235 | |
| 273 | c | =F236 | | =F237 |
| 274 | d | =F238 | | =F239 |

FIG. 44

| | H | I | J | K | L | M | N | O |
|---|---|---|---|---|---|---|---|---|
| | | | | Y-pos | | | | Y-pos |
| | | X-pos | Y-pos | idle | | X-pos | Y-pos | idle |
| | | | signals | | | | signals | |
| 269 | | | | | | | | |
| 270 | | | | | | | | |
| 271 | a | =J232 | =J233 | | a | =N232 | =N233 | |
| 272 | b | =J234 | =J235 | | b | =N234 | =N235 | |
| 273 | c | =J236 | | =J237 | c | =N236 | | =N237 |
| 274 | d | =J238 | | =J239 | d | =N238 | | =N239 |

|   | P | Q | R | S | T | U | V | W |
|---|---|---|---|---|---|---|---|---|
|   |   | X-pos | Y-pos |   |   | X-pos | Y-pos | Y-pos |
| 269 |   |   | signals |   |   |   | signals | idle |
| 270 |   |   |   | idle |   |   |   |   |
| 271 | a | =R232 | =R233 |   | a | =V232 | =V233 |   |
| 272 | b | =R234 | =R235 |   | b | =V234 | =V235 |   |
| 273 | c | =R236 |   | =R237 | c | =V236 |   | =V237 |
| 274 | d | =R238 |   | =R239 | d | =V238 |   | =V239 |

FIG. 47

|   | X | Y | Z | AA | AB | AC |
|---|---|---|---|---|---|---|
|   |   |   | X-pos |   | Y-pos | Y-pos |
| 269 |   |   |   |   | signals | idle |
| 270 |   |   |   |   |   |   |
| 271 |   | a | =AB232 |   | =AB233 |   |
| 272 |   | b | =AB234 |   | =AB235 |   |
| 273 |   | c | =AB236 |   |   | =AB237 |
| 274 |   | d | =AB238 |   |   | =AB239 |

HIGH-FREQUENCY, HIGH-SIGNAL-DENSITY, SURFACE-MOUNT TECHNOLOGY FOOTPRINT DEFINITIONS

CROSS-REFERENCE TO RELATED APPLICATIONS

This application claims benefit under 35 U.S.C. § 119(e) of provisional U.S. patent application Ser. No. 60/631,499, filed Nov. 29, 2004.

This application is related to U.S. patent application Ser. No. 11/287,926, filed Nov. 28, 2005, to provisional U.S. patent application Ser. No. 60/631,545, filed Nov. 29, 2004, and to provisional U.S. patent application Ser. No. 60/686,514, filed Jun. 1, 2005.

The contents of each of the above-referenced U.S. patent applications is incorporated herein by reference.

FIELD OF THE INVENTION

Generally, the invention relates to electrical connector/circuit board systems. More particularly, the invention relates to methodologies for defining high-frequency, high-signal-density, surface-mount-technology footprints on such circuit boards.

BACKGROUND OF THE INVENTION

Typically, an electrical component, such as an electrical connector, for example, may include a plurality of electrically-conductive contacts, the terminal portions of which may be arranged in a matrix of rows and columns, for example. The contacts L may be signal conductors or ground conductors, and may be arranged along columns in a signal-signal-ground arrangement. Adjacent signal contacts may form differential signal pairs, though the signal contacts may be single-ended signal conductors. Such a component may include any combination of differential signal pairs and single-ended signal conductors.

An electrical component may be mounted to a circuit board using surface mount technology (SMT). SMT involves electrically connecting terminal ends of the contacts to the surface of the substrate by electrically connecting each terminal end to a respective SMT pad located on the surface of the substrate. The terminal ends of the contacts, which may include electrically-conductive solder balls, for example, are typically soldered to the pads. On multi-layer boards, the SMT pads are typically electrically connected to vias that extend between the layers of the board and electrically connect SMT pads or traces on one layer to traces on another layer.

FIG. 1 depicts a typical SMT connector footprint comprising a plurality of SMT pads P arranged in a pad arrangement and a plurality of vias V arranged in a via arrangement. Each of the vias V is electrically connected to a respective one of the SMT pads P. The SMT pads P and vias V may be arranged in a so-called "dog-bone" pattern, as shown. As shown in the inset, a "dog bone" may include an SMT pad P, a via V, a via pad VP, and an electrically conductive via trace VT that electrically connects the via pad and the SMT pad. It should be understood, however, that vias and SMT pads need not be arranged in such a dog-bone pattern. Alternatively, an SMT pad may overlap partially or completely with a corresponding via pad such that there is a direct connection between the SMT pad and the via pad. Such a configuration is typically referred to as "via-in-pad."

The SMT pads and vias may be arranged into rows and columns. As shown in FIG. 1, columns extend along the horizontal direction, perpendicular to the board edge E. Rows extend along the vertical direction, parallel to the board edge E. The spacing between the centerlines of adjacent rows may be referred to as the row pitch $P_R$. The spacing between the centerlines of adjacent columns may be referred to as the column pitch $P_C$.

The SMT pads P and vias V may be ground conductors or signal conductors. Signal conductors may be used in either single-ended or differential signal transmission. High-speed (i.e., greater than 1 GHz) connectors typically use differential signal pairs for signal transmission. In differential signal transmission, each signal conductor may be paired with an adjacent signal conductor. A respective ground conductor may be disposed between adjacent pairs of signal conductors. In some connector systems, ground conductors may be included to decrease cross-talk among the signal conductors, and to promote impedance-matching.

The pad arrangement depicted in FIG. 1 may be the same as the lead arrangement in the component to be surface-mounted onto the board. For example, the SMT pads may be arranged into rows and columns just as the terminal portions of the leads are arranged into rows and columns. Further, the row pitch $P_R$ and column pitch $P_C$ of the pad arrangement may be the same as the row pitch and column pitch of the lead arrangement.

Similarly, the via arrangement may be the same as the pad arrangement. That is, the vias V may be arranged into rows and columns, for example, just as the SMT pads P are arranged into rows and columns. Further, the row pitch $P_{VR}$ and column pitch $P_{VC}$ of the via arrangement may be the same as the row pitch $P_R$ and column pitch $P_C$ of the pad arrangement.

High-frequency, high-signal-density connectors, i.e., connectors that operate at data transmission rates in excess of about 1 GHz and have on the order of 200 or more signal pairs per square inch, are becoming known in the art. It would be desirable, therefore, if methodologies were available for defining footprints for such high-frequency, high-signal-density connectors wherein, within constraints of impedance and routing density, cross-talk may be limited to acceptable levels.

SUMMARY OF THE INVENTION

The invention provides iterative methods and tools that are particularly suitable for designing board/connector systems. A user may input data associated with one or more parameters that define an SMT footprint geometry. The input data may be used to generate a sample footprint and to calculate the anticipated electrical performance of the footprint. The user may change the input data, thus causing the generated footprint and anticipated performance data to be updated accordingly. The user may continue to change the footprint until the user is satisfied with the geometry and performance of the generated footprint.

The invention provides circuit board, such as backplane or printed circuit boards, for example, for receiving an electrical component having a contact arrangement of electrically conductive contacts. The circuit board may include an arrangement of vias and SMT pads that may be different from the contact arrangement. Terminal ends of the contacts housed by such a connector may be jogged or bent to electrically connect with the SMT pads on the circuit board. The SMT pads and vias may be arranged in a number of ways that allow for increased signal contact density, while limiting cross-talk among signal conductors and providing adequate space for routing of traces on the circuit board.

BRIEF DESCRIPTION OF THE DRAWINGS

FIGS. 5A and 5B are example screen shots of a system for generating an SMT connector footprint in accordance with the invention.

FIGS. 8-47 provide a spreadsheet detailing the computations used to determine certain characteristics of the SMT footprint depicted in FIG. 2.

DETAILED DESCRIPTION OF ILLUSTRATIVE EMBODIMENTS

Figure 1:
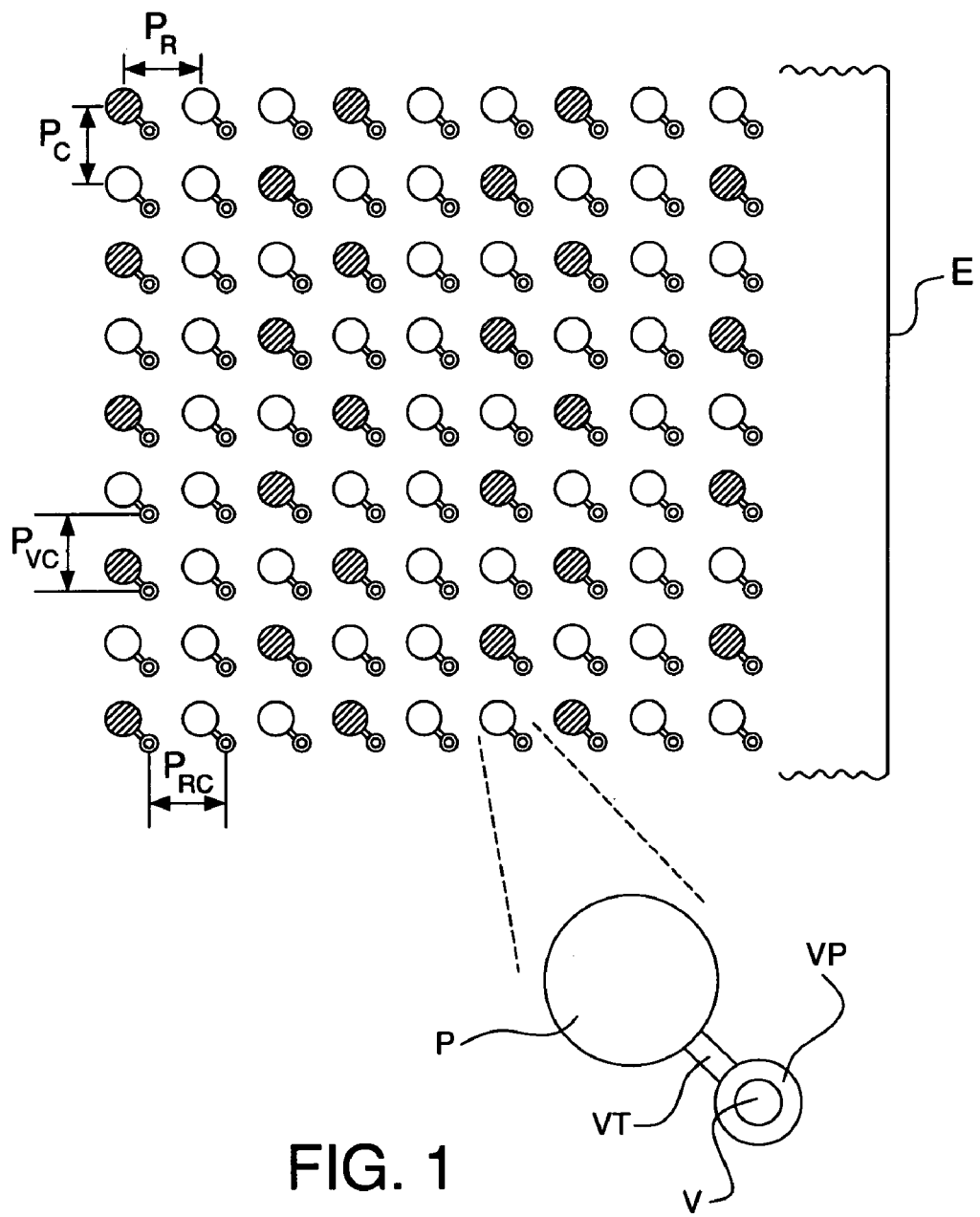
FIG. 1 depicts a typical SMT connector footprint.
Figure 2:
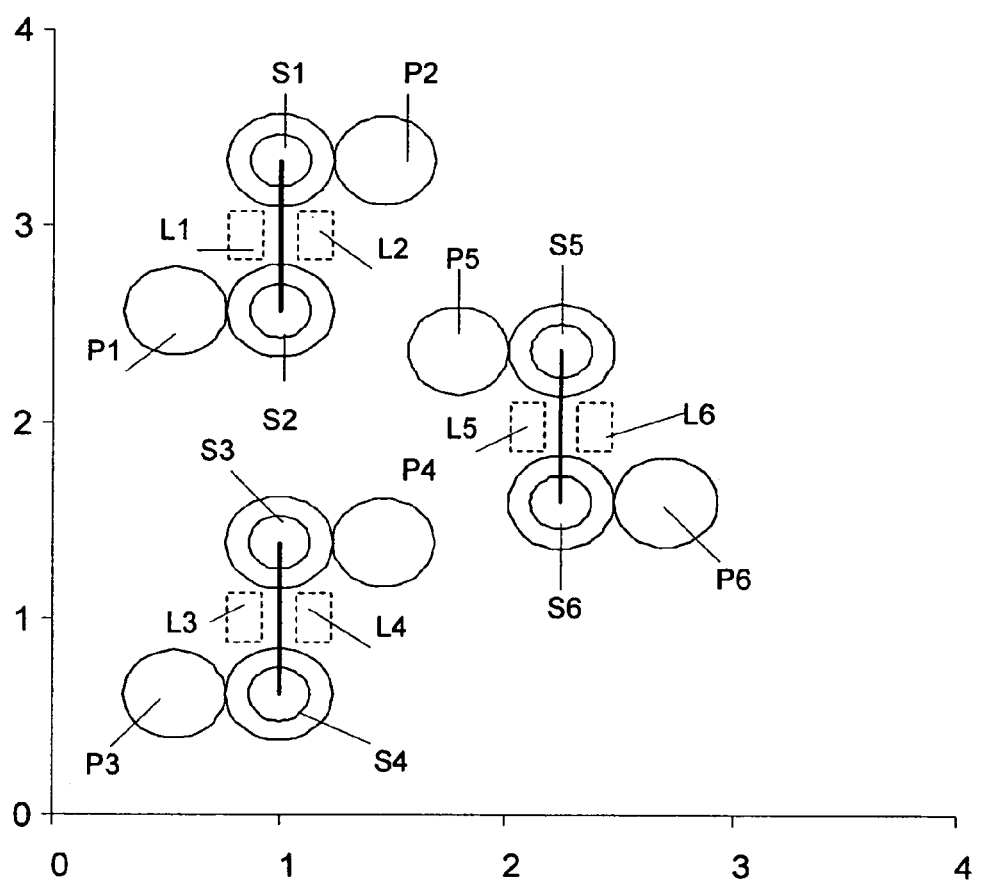
FIG. 2 depicts an example SMT connector footprint generated in accordance with the invention.

FIG. 2 depicts an example SMT connector footprint in accordance with an embodiment of the invention. As shown, the connector footprint may include a plurality of signal-conductor vias S1-S6 and a plurality of signal-conductor SMT pads P1-P6. The SMT pads and vias may be arranged in a so-called "dog-bone" pattern, such that each via is separate from, and electrically connected to, a respective SMT pad. In a typical dog-bone pattern, circuit board traces (not shown in FIG. 2) electrically connect the vias S1-S6 with respective ones of the SMT pads P1-P6. Alternatively, as described above, the vias and SMT pads may be arranged in a so-called "via-in-pad" arrangement.

The signal conductor vias may be used in either single-ended or differential transmission. In differential signal transmission, each signal conductor via may be paired with an adjacent signal conductor via. Via pairs are illustrated in FIG. 2 by a line connecting paired vias. If the connector to be received by the footprint includes ground contacts, then the connector footprint may also include ground conductor pads and ground conductor vias (not shown). It should be understood that the via arrangement may include any or all of differential signal pairs of signal conductor vias, single-ended signal conductor vias, and/or ground conductor vias.

Also illustrated as dashed boxes in FIG. 2 are representative locations of electrical contacts T1-T6 housed within a connector the board may be adapted to receive. The dashed boxes indicate the relative locations of the respective contact leads L1-L6 within the connector. As described above, each contact may form an electrical connection with a respective SMT pad through a ball disposed at the terminal end of the contact. The corresponding SMT pad may be disposed to receive the ball, and thus form an electrical connection between the contact in the connector and the corresponding SMT pad (and, therefore, with the corresponding via). As shown in FIG. 2, the contact leads L1-L6 need not align within the corresponding SMT pads P1-P6. That is, the arrangement of SMT pads on the footprint may differ from the arrangement of contacts in the connector. Accordingly, the terminal ends of the contacts may be jogged or bent so that the terminal ends of the contacts align to form electrical connections with the respective SMT pads.

Figure 3:
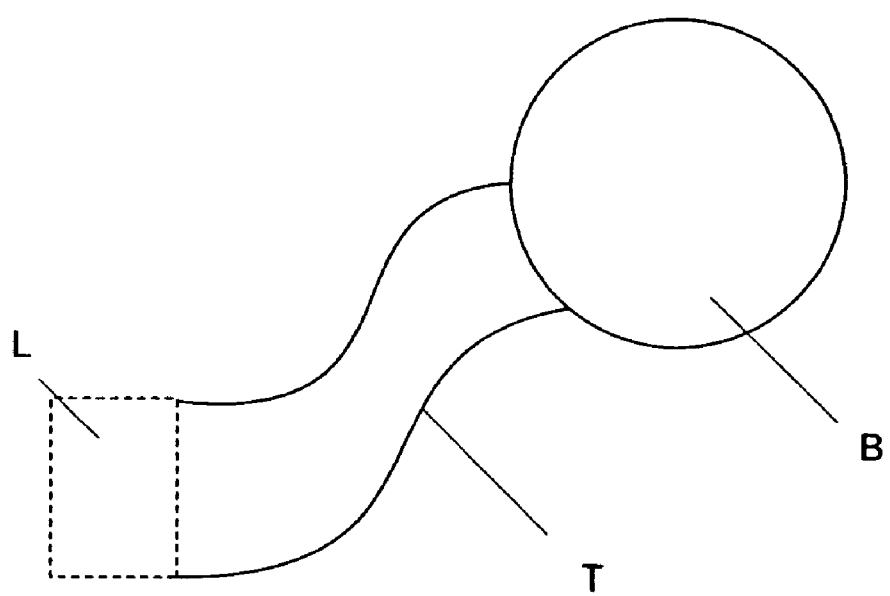
FIG. 3 depicts a jogged terminal end of a BGA contact that is suitable for connection to an SMT footprint in accordance with the invention.

An example "S-shaped" terminal portion T that may be used in such a connector is depicted in FIG. 3. As shown, the terminal portion T may connect the contact lead L with a ball B. The terminal portion T may emanate from the contact lead L in any direction, and take any shape necessary to enable an electrical contact between the ball B and the SMT pad on the substrate that is adapted to receive the connector. It should be understood that the terminal portion T of such an S-shaped terminal end may be short enough and provide sufficient control of impedance to meet high-frequency, signal-integrity requirements.

Figure 4:
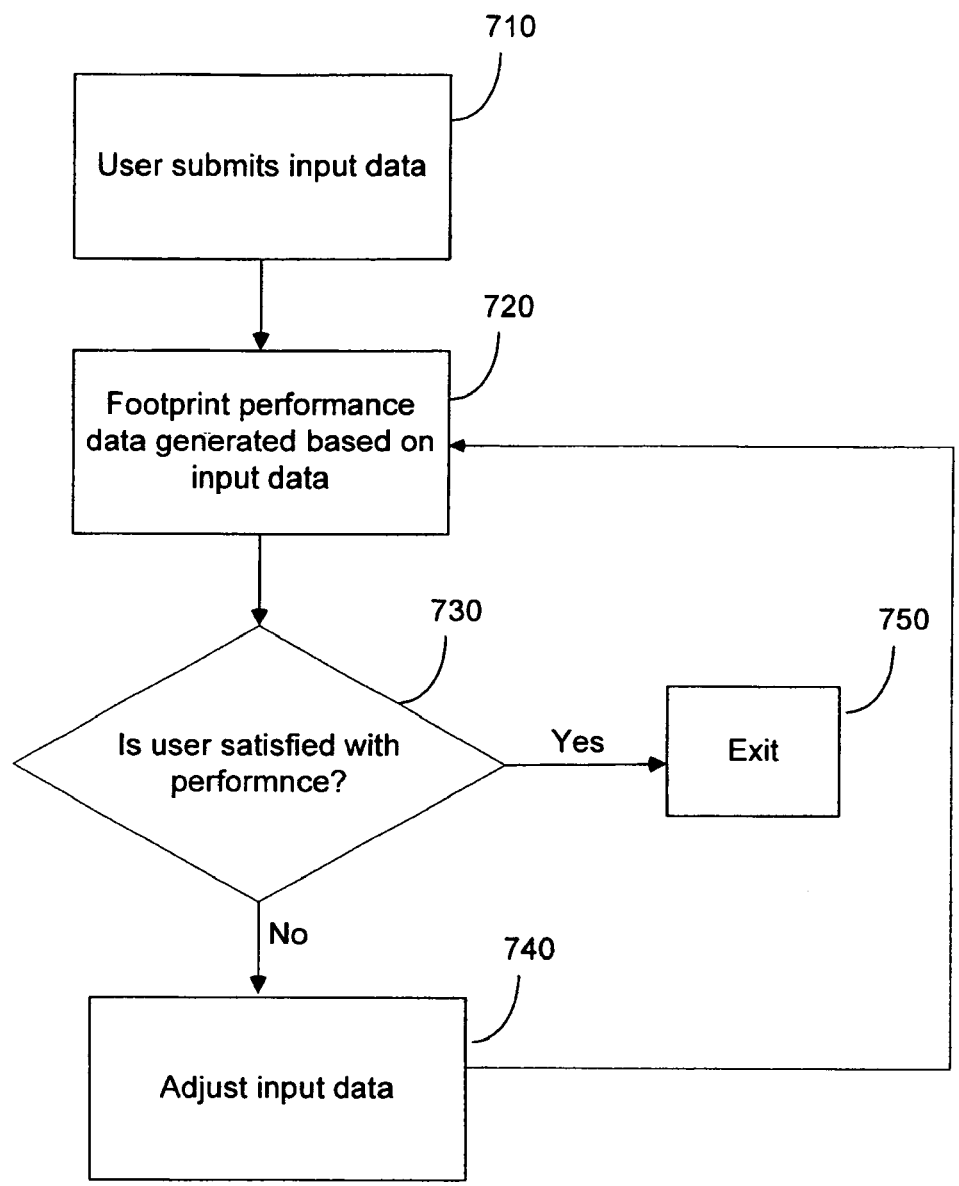
FIG. 4 is a flowchart of an example embodiment of a method for generating an SMT connector footprint in accordance with the present invention.

FIG. 4 is a flowchart of an example embodiment of a method for generating an SMT connector footprint in accordance with the present invention. As described above with respect to FIG. 2, a greater signal contact density can be achieved, while maintaining acceptable cross-talk levels and routing space, by placing the SMT pad locations on the substrate in an arrangement that differs from the contact arrangement. For example, though the SMT pads may be arranged in the same arrangement as the terminal ends of the contacts, the terminal ends of the contacts may be jogged or bent away from the contact leads such that the terminal ends of the contacts form an arrangement that is different from the contact arrangement, even though it may be the same as the SMT pad arrangement. As described above, removing the constraint that the pads are placed in an arrangement that is the same as the contact arrangement on the connector provides for a large number of new, previously unknown SMT footprint definitions.

Given the turn-around time associated with designing a new footprint, submitting it for fabrication, and testing board/connector design, it is desirable that designers be able to simulate a proposed BGA connector footprint, and receive feedback on its performance. Accordingly, FIG. 4 provides a method whereby a user may input certain data associated with certain parameters that define a geometric layout of an SMT connector footprint. Using the input parameters, an anticipated electrical performance associated with the footprint may be calculated. The user may compare the anticipated performance with some predetermined performance goals. If the anticipated performance does not meet the performance goals, the user may change the input data. The anticipated performance may then be recalculated. The user may continue to change the input data until the user is satisfied with the anticipated performance.

At 710, a user may provide data associated with one or more parameters sufficient to describe a geometric layout of an SMT connector footprint. The parameters may include, but are not limited to, pair pitch parameters, terminal parameters, ball and pad parameters, and via parameters. The data may be input by a user into a computer software application, such as spreadsheet, for example, that provides a user interface for receiving such data. An example screen shot of such a user interface is provided as FIG. 5A. As shown, the user may be provided with a respective text box associated with each of the input parameters via which the user can input the desired data.

The pair pitch parameters may include row pitch, column pitch, and an indication as to whether the pairs are paired along rows or columns. The row and column pitches may be measured from the centerlines of adjacent rows and columns and may be referred to herein as $P_R$ and $P_C$. The terminal parameters may include terminal end width, terminal end height, and the horizontal and vertical distances between adjacent terminal ends. The ball and pad parameters may include pad diameter, ball diameter, horizontal pad pitch, and vertical pad pitch. Horizontal pad pitch represents the distance between the center of a pad and a column centerline. Similarly, vertical pad pitch represents the distance between a row centerline and the center of a pad. The via parameters may include via drill diameter, annular ring, via-to-via in-pair horizontal pitch, via-to-via vertical pitch, and drill-to-trace clearance.

At 720, the application computes and displays anticipated electrical performance based on the input data and generates a visual depiction of the defined connector footprint. Examples of such visual depictions are provided in FIG. 2, which is described in detail above, and in FIGS. 7-9, which are described in detail below. The anticipated performance data may be displayed to the user as shown in the example screen shot provided as FIG. 5B. If the application is unable to resolve the data, then the unresolvable data conflict may be brought to the attention of the user via the user interface.

The performance data may include, but is not limited to, density data, crosstalk data, impedance data, dog-bone and clearance data, and routing width and trace width data.

Density data may be expressed is terms of vias per square inch, or alternatively via pairs per square inch.

Cross-talk data may be calculated for cross-talk between via pairs, as well as multi-active cross-talk among the via pairs. Cross-talk data may also be calculated for cross-talk between pad pairs, as well as multi-active cross-talk among the pad pairs. Cross-talk data may be calculated using any of a number of well-known techniques that need not be described here.

Impedance data may include differential impedance calculations for both pad pairs and via pairs. Impedance may be calculated using any of a number of well-known techniques that need not be described here.

The dog-bone and clearance data may include distance within a dog bone between the SMT pad and via pad that form the dog bone, minimum clearance pad-to-pad, pair-to-pair distance between via pads, minimum clearance between via pads, and minimum clearances between SMT pads and via pads.

Routing width and trace width data may include pad-to-trace clearance, trace width using straight traces, and trace width using serpentine traces.

At 730, the user has received the proposed footprint and generated performance data. Before entering the input parameters, the user may have had specific minimum or performance goals for the BGA connector footprint. For example, the user may be interested only in designs that are capable of a via density greater than 200 via pairs per square inch. Once the user has viewed the generated performance, the user may desire to further refine the input parameters in order to bring the anticipated performance data closer to the performance goals. If the user is not satisfied with the anticipated performance of the BGA footprint design, the user may continue to 740 where the user may further refine the input data. Otherwise, if the user is satisfied with the design, the user may exit the application at 750.

At 740, the user has decided to make further changes to the data associated with the input parameters. The user may adjust any of the previously submitted input data and view the resulting changes to the footprint and the anticipated electrical performance. After the user changes one or more of the parameters, the resulting output data and generated footprint depiction may be updated and displayed at 720. The user may continue to change the data associated with one or more of the input parameters, and viewing the corresponding results, until a suitable SMT footprint is generated.

As discussed above, a visual depiction of the defined footprint may also be generated. Examples of such footprint depictions are provided in FIGS. 3, 6, and 7. In each example shown, the generated footprint includes six vias S1-S6 and six SMT pads P1-P6. Contact leads L1-L6 are indicated as dashed boxes. Via pairs are indicated with lines between the vias that form the pairs. Though the example footprints depict six vias and six SMT pads, it should be understood that a footprint defined in accordance with the invention may have any number of vias and SMT pads. In a typical dog-bone pattern, circuit board traces (not shown) electrically connect the vias S1-S6 with respective ones of the SMT pads P1-P6. As shown, each of the example SMT footprints provides a signal density of more than 250 via pairs per square inch, acceptable levels of cross-talk and impedance, and adequate routing space on the board.

FIG. 2 depicts an example SMT footprint that achieves a signal density of 265 via pairs per square inch while maintaining acceptable routing density, and impedance and cross-talk levels. The footprint depicted in FIG. 2 was generated using the input data provided in the following table:

| Layout Description: | Pairing, Row or Column | units | Col |
|---|---|---|---|
| Pair Pitch | Pair pitch, horizontal | mm | 1.25 |
| | Pair pitch, vertical | mm | 1.95 |
| Terminals | Width | mm | 0.15 |
| | Height | mm | 0.25 |
| | Terminal to terminal, in-pair horizontal | mm | 0.30 |
| | Terminal to terminal, in-pair vertical | mm | 0.00 |
| BGA Balls & Pads | BGA ball diameter | mm | 0.60 |
| | BGA pad diameter | mm | 0.45 |
| | Pitch Pad - pad, in-pair horizontal | mm | 0.92 |
| | Pitch Pad-pad, in-pair vertical | mm | 0.77 |
| Vias | Via drill diameter | mm | 0.27 |
| | Annular ring | mm | 0.15 |
| | Pitch via—via, in-pair horizontal | mm | 0.00 |
| | Pitch via—via, in-pair vertical | mm | 0.77 |
| | Drill to trace clearance | mm | 0.25 |

Using a method such as described in connection with FIG. 4, the SMT footprint depicted in FIG. 2 was generated with the characteristics as shown in the following table:

| | | | | |
|---|---|---|---|---|
| Density | Density (in-grid) | | pr/in$^2$ | 265 |
| X-talk | Nxt balls prs 1-2 | NxtB12 | % | 0.12 |
| | Nxt balls prs 1-3 | NxtB13 | % | 0.11 |
| | Nxt balls prs 2-3 | NxtB23 | % | 0.11 |
| | Multiactive Nxt balls Isolation | MXtBdB | dB | 43.5 |
| | Nxt vias prs 1-2 | NxtV12 | % | −0.52 |
| | Nxt vias prs 1-3 | NxtV13 | % | 0.24 |
| | Nxt vias prs 2-3 | NxtV23 | % | 0.24 |
| | Multiactive Nxt Via Isolation | MXtVdB | dB | 34.1 |
| Impedance | Differential impedance balls | ZoB | ohm | 143 |
| | Differential impedance vias | ZoV | ohm | 75 |
| Dogbone & Clearance | Dogbone BGApad to viapad (in-dogbone)) | Cbv(db) | mm | 0.00 |
| | Min clearance Ball to Ball | Cbb | mm | 0.43 |
| | Min clearance Viapad to Viapad | Cvv | mm | 0.30 |
| | Min clearance BGApad to Viapad | Cbv | mm | 0.36 |
| Routing Width & Trace Width | Clearance pad-trace (internal) | Cpt | mm | 0.20 |
| | Indicated trace width straight = RWx/3.2 | Wx | mm | 0.15 |
| | Indicated trace width serpentine = RWd/3.2 | Ws | mm | 0.16 |

Figure 6:
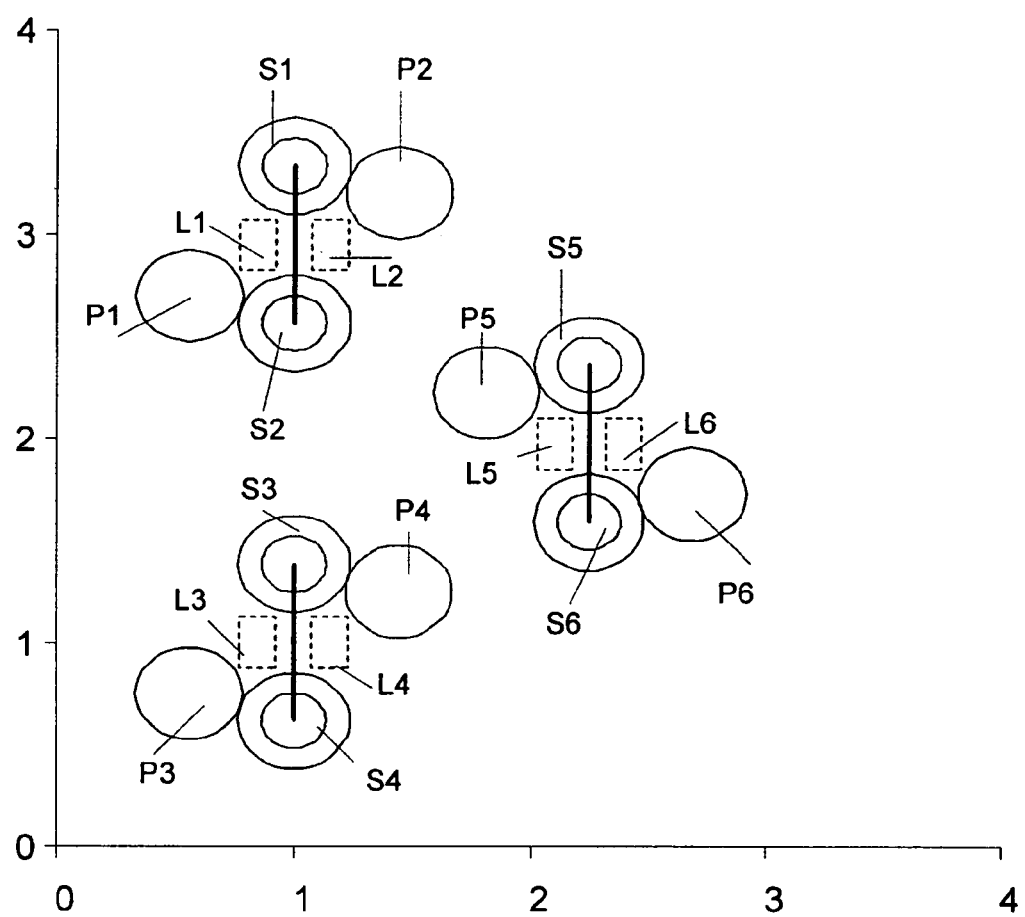
FIGS. 6 and 7 depict other example SMT connector footprints generated in accordance with the invention.

FIG. 6 depicts an example SMT footprint that achieves a signal density of 265 via pairs per square inch while maintaining acceptable routing density, and impedance and crosstalk levels. The footprint depicted in FIG. 6 was generated using the input data provided in the following table:

| Layout Description: | Pairing, Row or Column | units | Col |
|---|---|---|---|
| Pair Pitch | Pair pitch, horizontal | mm | 1.25 |
| | Pair pitch, vertical | mm | 1.95 |
| Terminals | Width | mm | 0.15 |
| | Height | mm | 0.25 |
| | Terminal to terminal, in-pair horizontal | mm | 0.30 |
| | Terminal to terminal, in-pair vertical | mm | 0.00 |
| BGA Balls & Pads | BGA ball diameter | mm | 0.60 |
| | BGA pad diameter | mm | 0.45 |
| | Pitch Pad - pad, in-pair horizontal | mm | 0.88 |
| | Pitch Pad-pad, in-pair vertical | mm | 0.50 |
| Vias | Via drill diameter | mm | 0.27 |
| | Annular ring | mm | 0.15 |
| | Pitch via—via, in-pair horizontal | mm | 0.00 |
| | Pitch via—via, in-pair vertical | mm | 0.77 |
| | Drill to trace clearance | mm | 0.25 |

Using a method such as described in connection with FIG. 4, the SMT footprint depicted in FIG. 6 was generated with the characteristics as shown in the following table:

| | | | | |
|---|---|---|---|---|
| Density | Density (in-grid) | | pr/in^2 | 265 |
| X-talk | Nxt balls prs 1-2 | NxtB12 | % | 0.16 |
| | Nxt balls prs 1-3 | NxtB13 | % | 0.06 |
| | Nxt balls prs 2-3 | NxtB23 | % | 0.06 |
| | Multiactive Nxt balls Isolation | MXtBdB | dB | 44.8 |
| | Nxt vias prs 1-2 | NxtV12 | % | −0.52 |
| | Nxt vias prs 1-3 | NxtV13 | % | 0.4 |
| | Nxt vias prs 2-3 | NxtV23 | % | 0.24 |
| | Multiactive Nxt Via Isolation | MXtVdB | dB | 34.1 |
| Impedance | Differential impedance balls | ZoB | ohm | 126 |
| | Differential impedance vias | ZoV | ohm | 75 |
| Dogbone & Clearance | Dogbone BGApad to viapad (in-dogbone)) | Cbv(db) | mm | 0.00 |
| | Min clearance Ball to Ball | Cbb | mm | 0.41 |
| | Min clearance Viapad to Viapad | Cvv | mm | 0.30 |
| | Min clearance BGApad to Viapad | Cbv | mm | 0.31 |
| Routing Width & Trace Width | Clearance pad-trace (internal) | Cpt | mm | 0.20 |
| | Indicated trace width straight = RWx/3.2 | Wx | mm | 0.15 |
| | Indicated trace width serpentine = RWd/3.2 | Ws | mm | 0.16 |

Figure 7:
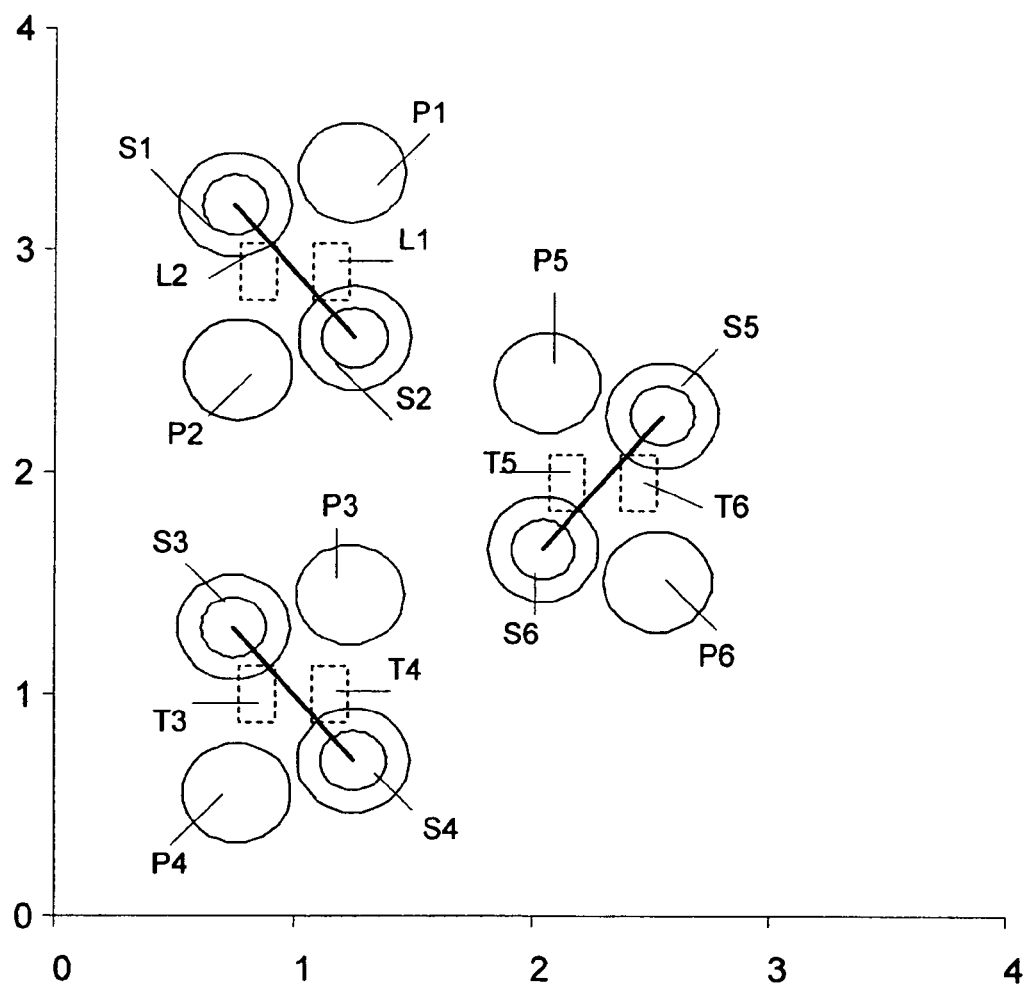

FIG. 7 depicts an example SMT footprint that achieves a signal density of 261 via pairs per square inch while maintaining acceptable routing density, and impedance and crosstalk levels. The footprint depicted in FIG. 7 was generated using the input data provided in the following table:

| Layout Description: | Pairing, Row or Column | units | Col |
|---|---|---|---|
| Pair Pitch | Pair pitch, horizontal | mm | 1.30 |
| | Pair pitch, vertical | mm | 1.90 |
| Terminals | Width | mm | 0.15 |
| | Height | mm | 0.25 |
| | Terminal to terminal, in-pair horizontal | mm | 0.30 |
| | Terminal to terminal, in-pair vertical | mm | 0.00 |
| BGA Balls & | BGA ball diameter | mm | 0.60 |

-continued

| Layout Description: | Pairing, Row or Column | units | Col |
|---|---|---|---|
| Pads | BGA pad diameter | mm | 0.45 |
| | Pitch Pad - pad, in-pair horizontal | mm | 0.47 |
| | Pitch Pad-pad, in-pair vertical | mm | 0.89 |
| Vias | Via drill diameter | mm | 0.27 |
| | Annular ring | mm | 0.15 |
| | Pitch via-via, in-pair horizontal | mm | 0.50 |
| | Pitch via-via, in pair vertical | mm | 0.60 |
| | Drill to trace clearance | mm | 0.25 |

Using a method such as described in connection with FIG. 4, the SMT footprint depicted in FIG. 7 was generated with the characteristics as shown in the following table:

| | | | | |
|---|---|---|---|---|
| Density | Density (in-grid) | | pr/in^2 | 261 |
| X-talk | Nxt balls prs 1-2 | NxtB12 | % | −0.15 |
| | Nxt balls prs 1-3 | NxtB13 | % | 0.16 |
| | Nxt balls prs 2-3 | NxtB23 | % | 0.16 |
| | Multiactive Nxt balls Isolation | MXtBdB | dB | 41 |
| | Nxt vias prs 1-2 | NxtV12 | % | −0.05 |
| | Nxt vias prs 1-3 | NxtV13 | % | 0.23 |
| | Nxt vias prs 2-3 | NxtV23 | % | 0.23 |
| | Multiactive Nxt Via Isolation | MXtVdB | dB | 40 |
| Impedance | Differential impedance balls | ZoB | ohm | 125 |
| | Differential impedance vias | ZoV | ohm | 76 |
| Dogbone & Clearance | Dogbone BGApad to viapad (in-dogbone)) | Cbv(db) | mm | 0.05 |
| | Min clearance Ball to Ball | Cbb | mm | 0.41 |
| | Min clearance Viapad to Viapad | Cvv | mm | 0.31 |
| | Min clearance BGApad to Viapad | Cbv | mm | 0.29 |
| Routing Width & Trace Width | Clearance pad-trace (internal) | Cpt | mm | 0.20 |
| | Indicated trace width straight = RWx/3.2 | Wx | mm | 0.01 |
| | Indicated trace width serpentine = RWd/3.2 | Ws | mm | 0.15 |

FIGS. 8-47 provide a spreadsheet detailing the computations used to determine the characteristics of the SMT footprint depicted in FIG. 2. The spreadsheet provided in FIGS. 8-47 also details the computations used to determine data points from which the visual depiction of the footprint depicted in FIG. 2 was generated. The characteristics of the footprints depicted in FIGS. 6 and 7, as well as the data points from which the visual depictions the footprints were generated, were calculated using the same formulae. It should be understood that a spreadsheet is merely an example of one possible way in which a tool according to the invention may be implemented. It should also be understood that the specific computations used to compute certain characteristics from certain input data are merely examples, and that any formulae known to those skilled in the art for such purposes may be used.

Thus there have been described several embodiments of footprint definitions for SMT connectors. It should be understood that the foregoing illustrative embodiments have been provided merely for the purpose of explanation and are in no way to be construed as limiting of the invention. For example, the foregoing example embodiments were described in connection with arrangements including only differential pairs of signal conductors. It is expected, however, that suitable arrangements may be designed for connectors that include ground conductors. Similarly, it is expected that suitable arrangements may be designed for connectors having only single-ended signal conductors, and for connectors having combinations of differential signal pairs, single-ended signal conductors, and ground conductors.

What is claimed:

1. An interactive method for defining a surface mount technology ("SMT") footprint, the method comprising:
   receiving first input data that defines a geometry associated with a first SMT footprint;
   generating, based on the first input data, first output data indicative of an electrical performance of the first SMT footprint;
   after generating the first output data, then receiving second input data that defines a geometry associated with a second SMT footprint; and
   generating, based on the second input data, second output data indicative of an electrical performance of the second SMT footprint.

2. The method of claim 1, wherein at least one of the first and second footprints includes an arrangement of SMT pads and an arrangement of vias, and the arrangement of vias is different from the arrangement of SMT pads.

3. The method of claim 1, wherein (i) the SMT footprint is adapted to receive an electrical component that includes a plurality of electrically conductive contacts arranged in a contact arrangement; and (ii) at least one of the first and second SMT footprints includes an arrangement of SMT pads that differs from the contact arrangement.

4. The method of claim 3, wherein at least one of the contacts comprises a contact lead and a terminal portion that jogs away from the contact lead.

5. The method of claim 1, wherein the input data is received via a computer software application that provides a user interface for receiving the input data.

6. The method of claim 5, wherein the computer software application is a spreadsheet program.

7. The method of claim 5, wherein the computer software application generates and displays a visual depiction of at least one of the first and second SMT footprints.

8. The method of claim 1, wherein the input data includes data corresponding to pair pitch parameters, terminal parameters, ball and pad parameters, and via parameters.

9. The method of claim 1, wherein at least one of the first and second SMT footprints has a via density greater than 200 via pairs per square inch.

10. A tool for defining a surface mount technology ("SMT") footprint, the tool comprising:
    a user interface for receiving first input data that defines a geometry associated with a first SMT footprint and second input data that defines a geometry associated with a second SMT footprint; and
    a processor that (i) receives the first input data; (ii) generates, based on the first input data, first output data indicative of an electrical performance of the first SMT footprint; (iii) receives the second input data after generating the first output data; and (iv) generates, based on the second input data, second output data indicative of an electrical performance of the second SMT footprint.

11. The tool of claim 10, wherein at least one of the first and second SMT footprints includes an arrangement of SMT pads and an arrangement of vias, and the arrangement of vias is different from the arrangement of SMT pads.

12. The tool of claim 10, wherein (i) each of the first and second SMT footprints is adapted to receive an electrical component that includes a plurality of electrically conductive contacts arranged in a contact arrangement; and (ii) at least one of the first and second SMT footprints includes an arrangement of SMT pads that differs from the arrangement of contacts.

13. The tool of claim 10, wherein at least one of the contacts comprises a contact lead and a terminal portion that jogs away from the contact lead.

14. The tool of claim 10, wherein the user interface comprises a user interface of a computer software application.

15. The tool of claim 10, wherein the computer software application is a spreadsheet program.

16. The tool of claim 10, further comprising a user interface for displaying a visual depiction of at least one of the first and second SMT footprints.

17. The tool of claim 16, wherein a visual depiction of the first SMT footprint is displayed before the second input data is received.

18. The method of claim 10, wherein the input data includes data corresponding to pair pitch parameters, terminal parameters, ball and pad parameters, and via parameters.

19. The method of claim 10, wherein at least one of the first and second SMT footprints has a via density greater than 200 via pairs per square inch.

20. An interactive method for defining a surface mount technology ("SMT") footprint, the method comprising:
    receiving first input data that defines a geometry associated with a first SMT footprint;
    generating, based on the first input data, a visual depiction of the first SMT footprint;
    after generating the visual depiction of the first SMT footprint, then receiving second input data that defines a geometry associated with a second SMT footprint; and
    generating, based on the second input data, second output data indicative of an electrical performance of the second SMT footprint.

* * * * *